(12) United States Patent
Sadd et al.

(10) Patent No.: US 7,582,929 B2
(45) Date of Patent: Sep. 1, 2009

(54) ELECTRONIC DEVICE INCLUDING DISCONTINUOUS STORAGE ELEMENTS

(75) Inventors: Michael A. Sadd, Austin, TX (US); Ko-Min Chang, Austin, TX (US); Gowrishankar L. Chindalore, Austin, TX (US); Cheong M. Hong, Austin, TX (US); Craig T. Swift, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 162 days.

(21) Appl. No.: 11/188,999

(22) Filed: Jul. 25, 2005

(65) Prior Publication Data

US 2007/0018222 A1    Jan. 25, 2007

(51) Int. Cl.
 *H01L 29/94* (2006.01)
(52) U.S. Cl. .............................. 257/317; 257/E29.129
(58) Field of Classification Search ................. 257/317, 257/E29.129
See application file for complete search history.

(56) References Cited

U.S. PATENT DOCUMENTS

| | | | |
|---|---|---|---|
| 4,184,207 A | 1/1980 | McElroy | |
| 4,751,558 A | 6/1988 | Kenney | |
| 4,785,337 A | 11/1988 | Kenney | |
| 4,833,094 A | 5/1989 | Kenney | |
| 4,860,070 A | 8/1989 | Arimoto et al. | |
| 5,196,722 A | 3/1993 | Bergendahl et al. | |
| 5,252,845 A | 10/1993 | Kim et al. | |
| 5,315,142 A | 5/1994 | Acovic et al. | |
| 5,411,905 A | 5/1995 | Acovic et al. | |
| 5,432,365 A | 7/1995 | Chin et al. | |
| 5,460,988 A | 10/1995 | Hong | |
| 5,567,635 A | 10/1996 | Acovic et al. | |
| 5,705,415 A * | 1/1998 | Orlowski et al. | ............ 438/259 |
| 5,721,448 A | 2/1998 | Hauf et al. | |
| 5,786,612 A | 7/1998 | Otani et al. | |
| 5,801,415 A | 9/1998 | Lee et al. | |
| 5,824,580 A | 10/1998 | Hauf et al. | |
| 5,907,775 A | 5/1999 | Tseng | |
| 5,914,523 A | 6/1999 | Bashir et al. | |
| 5,923,046 A * | 7/1999 | Tezuka et al. | ................. 257/24 |
| 5,969,383 A | 10/1999 | Chang et al. | |
| 5,998,263 A | 12/1999 | Sekariapuram et al. | |

(Continued)

OTHER PUBLICATIONS

U.S. Appl. No. 11/626,768, filed Jan. 24, 2007.

(Continued)

*Primary Examiner*—Bradley K Smith
*Assistant Examiner*—Amar Movva

(57) ABSTRACT

An electronic device can include discontinuous storage elements that lie within a trench. In one embodiment, the electronic device can include a substrate having a trench that includes a wall and a bottom. The electronic device can also include a portion of discontinuous storage elements that lie within the trench. The electronic device can also include a first gate electrode, wherein at least one discontinuous storage element lies along the wall of the trench at an elevation between and upper surface of the first gate electrode and a primary surface of the substrate. The electronic device can also include a second gate electrode overlying the first gate electrode and the primary surface of the substrate. In another embodiment, a conductive line can be electrically connected to one or more rows or columns of memory cells, and another conductive line can be more rows or more columns of memory cells.

15 Claims, 19 Drawing Sheets

U.S. PATENT DOCUMENTS

| | | | |
|---|---|---|---|
| 6,060,743 A | 5/2000 | Sugiyama et al. | |
| 6,074,954 A | 6/2000 | Lill et al. | |
| 6,117,733 A | 9/2000 | Sung et al. | |
| 6,121,148 A | 9/2000 | Bashir et al. | |
| 6,133,601 A | 10/2000 | Watanabe | |
| 6,172,905 B1 | 1/2001 | White et al. | |
| 6,228,706 B1 | 5/2001 | Horak et al. | |
| 6,232,632 B1 | 5/2001 | Liu | |
| 6,265,268 B1 | 7/2001 | Halliyal et al. | |
| 6,281,064 B1 | 8/2001 | Mandelman et al. | |
| 6,287,917 B1 | 9/2001 | Park et al. | |
| 6,307,782 B1 | 10/2001 | Sadd et al. | |
| 6,320,784 B1 * | 11/2001 | Muralidhar et al. | 365/151 |
| 6,330,184 B1 | 12/2001 | White et al. | |
| 6,344,403 B1 | 2/2002 | Madhukar et al. | |
| 6,365,452 B1 | 4/2002 | Perng et al. | |
| 6,368,916 B1 | 4/2002 | Nakagawa | |
| 6,372,617 B1 | 4/2002 | Kitamura | |
| 6,373,096 B1 | 4/2002 | Hisamune et al. | |
| 6,399,441 B1 | 6/2002 | Ogura et al. | |
| 6,461,905 B1 | 10/2002 | Wang et al. | |
| 6,486,028 B1 | 11/2002 | Chang et al. | |
| 6,537,870 B1 | 3/2003 | Shen | |
| 6,544,827 B2 | 4/2003 | Abiko | |
| 6,555,427 B1 | 4/2003 | Shimizu et al. | |
| 6,559,032 B2 | 5/2003 | Gonzalez et al. | |
| 6,583,466 B2 | 6/2003 | Lin et al. | |
| 6,620,664 B2 | 9/2003 | Ma et al. | |
| 6,638,810 B2 | 10/2003 | Bakli et al. | |
| 6,673,681 B2 | 1/2004 | Kocon et al. | |
| 6,674,120 B2 | 1/2004 | Fujiwara | |
| 6,677,204 B2 | 1/2004 | Cleeves et al. | |
| 6,687,156 B2 | 2/2004 | Kobayashi et al. | |
| 6,706,599 B1 | 3/2004 | Sadd et al. | |
| 6,709,922 B2 | 3/2004 | Ebina et al. | |
| 6,713,834 B2 | 3/2004 | Mori et al. | |
| 6,734,492 B2 | 5/2004 | Yamazaki et al. | |
| 6,762,092 B2 | 5/2004 | Yuan et al. | |
| 6,747,308 B2 | 6/2004 | Mitros et al. | |
| 6,750,499 B2 | 6/2004 | Wu | |
| 6,803,620 B2 | 10/2004 | Moriya et al. | |
| 6,816,414 B1 | 11/2004 | Prinz | |
| 6,818,508 B2 | 11/2004 | Shimizu et al. | |
| 6,818,512 B1 | 11/2004 | Hsieh | |
| 6,818,939 B1 | 11/2004 | Hadizad | |
| 6,852,597 B2 | 2/2005 | Park et al. | |
| 6,853,587 B2 | 2/2005 | Forbes | |
| 6,864,540 B1 | 3/2005 | Divakaruni et al. | |
| 6,881,994 B2 | 4/2005 | Lee et al. | |
| 6,894,339 B2 | 5/2005 | Fan et al. | |
| 6,903,418 B2 | 6/2005 | Iwamoto et al. | |
| 6,916,715 B2 | 7/2005 | Hsiao et al. | |
| 6,936,887 B2 | 8/2005 | Harari et al. | |
| 6,952,034 B2 | 10/2005 | Hu et al. | |
| 6,991,984 B2 | 1/2006 | Ingersoll et al. | |
| 6,998,313 B2 | 2/2006 | Lin | |
| 7,015,537 B2 | 3/2006 | Lee et al. | |
| 7,037,787 B2 | 5/2006 | Fan et al. | |
| 7,045,423 B2 | 5/2006 | Ichige et al. | |
| 7,078,286 B1 | 7/2006 | Mehta | |
| 7,098,502 B2 | 8/2006 | Mathew et al. | |
| 7,122,432 B2 | 10/2006 | Shimizu et al. | |
| 7,126,188 B2 | 10/2006 | Shone | |
| 7,192,830 B2 | 3/2007 | Goldbach et al. | |
| 7,199,419 B2 | 4/2007 | Haller | |
| 7,220,634 B2 | 5/2007 | Prall et al. | |
| 7,259,984 B2 | 8/2007 | Kan et al. | |
| 7,279,740 B2 | 10/2007 | Bhattacharyya et al. | |
| 7,371,642 B2 | 5/2008 | Forbes | |
| 2002/0151136 A1 | 10/2002 | Lin et al. | |
| 2003/0062565 A1 * | 4/2003 | Yamazaki et al. | 257/315 |
| 2003/0071302 A1 | 4/2003 | Hirotomo et al. | |
| 2004/0000688 A1 | 1/2004 | Harari et al. | |
| 2004/0065921 A1 * | 4/2004 | Iwamoto et al. | 257/341 |
| 2004/0248371 A1 | 12/2004 | Wang | |
| 2005/0037576 A1 | 2/2005 | Chen et al. | |
| 2005/0146938 A1 | 7/2005 | Forbes | |
| 2005/0148173 A1 | 7/2005 | Shone | |
| 2005/0242391 A1 | 11/2005 | She et al. | |
| 2005/0259475 A1 | 11/2005 | Forbes | |
| 2005/0280089 A1 | 12/2005 | Forbes | |
| 2005/0280094 A1 | 12/2005 | Forbes | |
| 2006/0011966 A1 | 1/2006 | Wang | |
| 2006/0046383 A1 | 3/2006 | Chen et al. | |
| 2006/0131640 A1 | 6/2006 | Yu et al. | |
| 2006/0152978 A1 | 7/2006 | Forbes | |
| 2006/0166443 A1 | 7/2006 | Forbes | |
| 2007/0020851 A1 | 1/2007 | Hong et al. | |
| 2007/0020856 A1 | 1/2007 | Sadd et al. | |
| 2007/0238249 A1 | 10/2007 | Swift et al. | |

OTHER PUBLICATIONS

U.S. Appl. No. 11/626,762, filed Jan. 24, 2007.
U.S. Appl. No. 11/626,753, filed Jan. 24, 2007.
U.S. Appl. No. 11/188,935, filed Jul. 25, 2005.
U.S .Appl. No. 11/188,584, filed Jul. 25, 2005.
U.S. Appl. No. 11/188,953, filed Jul. 25, 2005.
U.S. Appl. No. 11/188,898, filed Jul. 25, 2005.
U.S. Appl. No. 11/188,910, filed Jul. 25, 2005.
U.S. Appl. No. 11/188,909, filed Jul. 25, 2005.
U.S. Appl. No. 11/188,591, filed Jul. 25, 2005.
U.S. Appl. No. 11/188,939, filed Jul. 25, 2005.
U.S. Appl. No. 11/188,588, filed Jul. 25, 2005.
U.S. Appl. No. 11/188,603, filed Jul. 25, 2005.
U.S. Appl. No. 11/188,615, filed Jul. 25, 2005.
U.S. Appl. No. 11/188,582, filed Jul. 25, 2005.
U.S. Appl. No. 11/188,583, filed Jul. 25, 2005.
U.S. Appl. No. 11/188,604, filed Jul. 25, 2005.
U.S. Appl. No. 11/188,585, filed Jul. 25, 2005.
Guan, H., et al., "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.
Hayashi, Y., et al. "Twin Monos Cell with Dual Control Gates," 2000 Symposium on VLSI Technology Digest of Technical Papers, pp. 122-123, 2000.
Lee, D., et al., "Vertical Floating-Gate 4.5F2 Split-Gate NOR Flash Memory at 110nm Node," 2004 Symposium on VLSI Technology Digest of Technical Papers, pp. 72-73, 2004.
Ma, Y. et al. "A Dual-Bit Split-Gate EEPROM (DSG) Cell in Contactless Array for Single-Vcc High Density Flash Memories," IEDM, p. 57-60, 1994.
Osabe, T. et al. "Charge-Injection Length in Silicon Nanocrystal Memory Cells," 2004 Symposium on VLSI Technology Digest of Technical Papers p. 242-243, 2004.
Van Houdt, J., et al., "An Analytical Model for the Optimization of Source-Side Injection Flash EEPROM Devices," IEEE Transactions on Electron Devices, vol. 42, No. 7, pp. 1314-1320, Jul. 1995.
U.S. Appl. No. 10/961,295, filed Oct. 8, 2004.
U.S. Appl. No. 11/079,674, filed Mar. 14, 2005.
U.S. Appl. No. 11/834;391, filed Aug. 6, 2007.
Actions on the Merits by U.S.P.T.O, as of Aug. 8, 2007, 8 pgs.
Actions on the Merits by U.S.P.T.O, as of Aug. 30, 2007, 9 pgs.
Actions on the Merits by U.S.P.T.O, as of Mar. 3, 2008 12 pgs.
Yang, Edward S., "8-3 Channel Conductance", Fundamentals of Semiconductor Devices, McGraw-Hill Book Company, p. 205, 1978.
Actions on the Merits by U.S.P.T.O, as of Sep. 16, 2008, 14 pgs.
Actions on the Merits by U.S.P.T.O, as of Oct. 24, 2008, 14 pgs.
Actions on the Merits by U.S.P.T.O, as of Dec. 30, 2008, 14 pgs.
Actions on the Merits by U.S.P.T.O, as of Nov. 8, 2007, 10 pgs.

* cited by examiner

| | GL1 2742 | GL2 2744 | GL3 2746 | GL4 2748 | GL5 2749 | BL1 2762 | BL2 2764 | BL3 2766 |
|---|---|---|---|---|---|---|---|---|
| PGM 27111 | 6 | 8 | 8 | 0 | 0 | 5 | 0 | F |
| READ 27111 | 3.5 | 6 | 6 | 0 | 0 | 0 | 2 | F |
| PGM 27112 | 8 | 6 | 6 | 0 | 0 | 5 | 0 | F |
| READ 27112 | 3.5 | 6 | 6 | 0 | 0 | 2 | 0 | F |
| PGM 27113 | 6 | 8 | 6 | 0 | 0 | 0 | 5 | F |
| READ 27113 | 6 | 3.5 | 6 | 0 | 0 | 0 | 2 | F |
| PGM 27114 | 6 | 8 | 6 | 0 | 0 | 5 | 0 | F |
| READ 27114 | 6 | 3.5 | 6 | 0 | 0 | 2 | 0 | F |
| PGM 27115 | 6 | 6 | 8 | 0 | 0 | 0 | 5 | F |
| READ 27115 | 6 | 6 | 3.5 | 0 | 0 | 0 | 2 | F |
| PGM 27116 | 8 | 8 | 6 | 0 | 0 | 0 | 5 | F |
| READ 27116 | 6 | 6 | 3.5 | 0 | 0 | 2 | 0 | F |
| PGM 27121 | 0 | 8 | 6 | 8 | 0 | 0 | 5 | 0 |
| READ 27121 | 0 | 6 | 3.5 | 6 | 0 | F | 0 | 2 |
| PGM 27122 | 0 | 6 | 8 | 6 | 0 | F | 5 | 0 |
| READ 27122 | 0 | 6 | 3.5 | 6 | 0 | F | 2 | 0 |
| PGM 27123 | 0 | 8 | 6 | 6 | 0 | F | 0 | 5 |
| READ 27123 | 0 | 3.5 | 6 | 6 | 0 | F | 0 | 2 |
| PGM 27124 | 0 | 8 | 6 | 6 | 0 | F | 5 | 0 |
| READ 27124 | 0 | 3.5 | 6 | 6 | 0 | F | 2 | 0 |
| PGM 27125 | 0 | 6 | 6 | 8 | 0 | F | 0 | 5 |
| READ 27125 | 0 | 6 | 6 | 3.5 | 0 | F | 0 | 2 |
| PGM 27126 | 0 | 8 | 8 | 6 | 0 | F | 0 | 5 |
| READ 27126 | 0 | 6 | 6 | 3.5 | 0 | F | 2 | 0 |

|  | GL1 3042 | GL2 3044 | GL3 3046 | GL4 3048 | GL5 3050 | GL6 3052 | BL1 3062 | BL2 3064 | BL3 3066 | BL4 3068 |
|---|---|---|---|---|---|---|---|---|---|---|
| PGM 30111 | 6 | 8 | 0 | 0 | 0 | 0 | 5 | F | 0 | F |
| READ 30111 | 3.5 | 6 | 0 | 0 | 0 | 0 | 0 | F | 2 | F |
| PGM 30112 | 8 | 6 | 0 | 0 | 0 | 0 | 5 | F | 0 | F |
| READ 30112 | 3.5 | 6 | 0 | 0 | 0 | 0 | 2 | F | 0 | F |
| PGM 30113 | 6 | 8 | 0 | 0 | 0 | 0 | 0 | F | 5 | F |
| READ 30113 | 6 | 3.5 | 0 | 0 | 0 | 0 | 0 | F | 2 | F |
| PGM 30114 | 8 | 6 | 0 | 0 | 0 | 0 | 0 | F | 5 | F |
| READ 30114 | 6 | 3.5 | 0 | 0 | 0 | 0 | 2 | F | 0 | F |
| PGM 30121 | 0 | 6 | 8 | 0 | 0 | 0 | 0 | F | 5 | F |
| READ 30121 | 0 | 3.5 | 6 | 0 | 0 | 0 | 2 | F | 0 | F |
| PGM 30122 | 0 | 8 | 6 | 0 | 0 | 0 | 0 | F | 5 | F |
| READ 30122 | 0 | 3.5 | 6 | 0 | 0 | 0 | 0 | F | 2 | F |
| PGM 30123 | 0 | 6 | 8 | 0 | 0 | 0 | 5 | F | 0 | F |
| READ 30123 | 0 | 6 | 3.5 | 0 | 0 | 0 | 2 | F | 0 | F |
| PGM 30124 | 0 | 8 | 6 | 0 | 0 | 0 | 5 | F | 0 | F |
| READ 30124 | 0 | 6 | 3.5 | 0 | 0 | 0 | 0 | F | 2 | F |
| PGM 30131 | 0 | 0 | 0 | 6 | 8 | 0 | 5 | F | F | 0 |
| READ 30131 | 0 | 0 | 0 | 3.5 | 6 | 0 | 0 | F | F | 2 |
| PGM 30132 | 0 | 0 | 0 | 8 | 6 | 0 | 5 | F | F | 0 |
| READ 30132 | 0 | 0 | 0 | 3.5 | 6 | 0 | 2 | F | F | 0 |
| PGM 30133 | 0 | 0 | 0 | 6 | 8 | 0 | 0 | F | F | 5 |
| READ 30133 | 0 | 0 | 0 | 6 | 3.5 | 0 | 0 | F | F | 2 |
| PGM 30134 | 0 | 0 | 0 | 8 | 6 | 0 | 0 | F | F | 5 |
| READ 30134 | 0 | 0 | 0 | 6 | 3.5 | 0 | 2 | F | F | 0 |
| PGM 30141 | 0 | 0 | 0 | 0 | 6 | 8 | 0 | F | F | 5 |
| READ 30141 | 0 | 0 | 0 | 0 | 3.5 | 6 | 2 | F | F | 0 |
| PGM 30142 | 0 | 0 | 0 | 0 | 8 | 6 | 0 | F | F | 5 |
| READ 30142 | 0 | 0 | 0 | 0 | 3.5 | 6 | 0 | F | F | 2 |
| PGM 30143 | 0 | 0 | 0 | 0 | 6 | 8 | 5 | F | F | 0 |
| READ 30143 | 0 | 0 | 0 | 0 | 6 | 3.5 | 2 | F | F | 0 |
| PGM 30144 | 0 | 0 | 0 | 0 | 8 | 6 | 5 | F | F | 0 |
| READ 30144 | 0 | 0 | 0 | 0 | 6 | 3.5 | 0 | F | F | 2 |

*FIG. 36*

|  | GL1 3342 | GL2 3344 | GL3 3346 | GL4 3348 | BL1 3362 | BL2 3364 | BL3 3366 | BL4 3368 | BL5 3369 |
|---|---|---|---|---|---|---|---|---|---|
| PGM 33111 | 6 | 8 | 0 | 0 | 5 | 0 | 0 | 0 | 0 |
| READ 33111 | 3.5 | 6 | 0 | 0 | 0 | 2 | 2 | 2 | 2 |
| PGM 33112 | 8 | 6 | 0 | 0 | 5 | 0 | 0 | 0 | 0 |
| READ 33112 | 3.5 | 6 | 0 | 0 | 2 | 0 | 0 | 0 | 0 |
| PGM 33113 | 6 | 8 | 0 | 0 | 0 | 5 | 5 | 5 | 5 |
| READ 33113 | 6 | 3.5 | 0 | 0 | 0 | 2 | 2 | 2 | 2 |
| PGM 33114 | 8 | 6 | 0 | 0 | 0 | 5 | 5 | 5 | 5 |
| READ 33114 | 6 | 3.5 | 0 | 0 | 2 | 0 | 0 | 0 | 0 |
| PGM 33121 | 8 | 6 | 0 | 0 | 5 | 5 | 0 | 0 | 0 |
| READ 33121 | 6 | 3.5 | 0 | 0 | 0 | 0 | 2 | 2 | 2 |
| PGM 33122 | 6 | 8 | 0 | 0 | 5 | 5 | 0 | 0 | 0 |
| READ 33122 | 3.5 | 6 | 0 | 0 | 2 | 2 | 0 | 0 | 0 |
| PGM 33123 | 8 | 6 | 0 | 0 | 0 | 0 | 5 | 5 | 5 |
| READ 33123 | 3.5 | 6 | 0 | 0 | 0 | 2 | 2 | 2 | 2 |
| PGM 33124 | 6 | 8 | 0 | 0 | 0 | 0 | 5 | 5 | 5 |
| READ 33124 | 3.5 | 6 | 0 | 0 | 2 | 2 | 0 | 0 | 0 |
| PGM 33131 | 6 | 0 | 8 | 0 | 5 | 5 | 5 | 0 | 0 |
| READ 33131 | 3.5 | 0 | 6 | 0 | 0 | 0 | 0 | 2 | 2 |
| PGM 33132 | 8 | 0 | 6 | 0 | 5 | 5 | 5 | 0 | 0 |
| READ 33132 | 3.5 | 0 | 6 | 0 | 2 | 2 | 2 | 0 | 0 |
| PGM 33133 | 6 | 0 | 8 | 0 | 0 | 0 | 0 | 5 | 5 |
| READ 33133 | 6 | 0 | 3.5 | 0 | 0 | 0 | 0 | 2 | 2 |
| PGM 33134 | 8 | 0 | 6 | 0 | 0 | 0 | 0 | 5 | 5 |
| READ 33134 | 6 | 0 | 3.5 | 0 | 2 | 2 | 2 | 0 | 0 |
| PGM 33141 | 8 | 0 | 6 | 0 | 5 | 5 | 5 | 5 | 0 |
| READ 33141 | 6 | 0 | 3.5 | 0 | 0 | 0 | 0 | 0 | 2 |
| PGM 33142 | 6 | 0 | 8 | 0 | 5 | 5 | 5 | 5 | 0 |
| READ 33142 | 3.5 | 0 | 6 | 0 | 2 | 2 | 2 | 2 | 0 |
| PGM 33143 | 8 | 0 | 6 | 0 | 0 | 0 | 0 | 0 | 5 |
| READ 33143 | 3.5 | 0 | 6 | 0 | 0 | 0 | 0 | 0 | 2 |
| PGM 33144 | 6 | 0 | 8 | 0 | 0 | 0 | 0 | 0 | 5 |
| READ 33144 | 3.5 | 0 | 6 | 0 | 2 | 2 | 2 | 2 | 2 |

*FIG. 39*

|  | GL1 3642 | GL2 3644 | GL3 3646 | GL4 3648 | BL1 3662 | BL2 3664 | BL3 3666 | BL4 3668 | BL5 3670 | BL6 3672 |
|---|---|---|---|---|---|---|---|---|---|---|
| PGM 36111 | 6 | 8 | 0 | 0 | 5 | 0 | 0 | 0 | 0 | 0 |
| READ 36111 | 3.5 | 6 | 0 | 0 | 0 | 2 | 2 | 0 | 0 | 0 |
| PGM 36112 | 8 | 6 | 0 | 0 | 5 | 0 | 0 | 0 | 0 | 0 |
| READ 36112 | 3.5 | 6 | 0 | 0 | 2 | 0 | 0 | 0 | 0 | 0 |
| PGM 36113 | 6 | 8 | 0 | 0 | 0 | 5 | 5 | 0 | 0 | 0 |
| READ 36113 | 6 | 3.5 | 0 | 0 | 0 | 2 | 2 | 0 | 0 | 0 |
| PGM 36114 | 8 | 6 | 0 | 0 | 0 | 5 | 5 | 0 | 0 | 0 |
| READ 36114 | 6 | 3.5 | 0 | 0 | 2 | 0 | 0 | 0 | 0 | 0 |
| PGM 36121 | 8 | 6 | 0 | 0 | 5 | 5 | 0 | 0 | 0 | 0 |
| READ 36121 | 6 | 3.5 | 0 | 0 | 0 | 2 | 2 | 0 | 0 | 0 |
| PGM 36122 | 8 | 6 | 0 | 0 | 5 | 0 | 0 | 0 | 0 | 0 |
| READ 36122 | 6 | 3.5 | 0 | 0 | 2 | 0 | 0 | 0 | 0 | 0 |
| PGM 36123 | 8 | 6 | 0 | 0 | 0 | 0 | 5 | 0 | 0 | 0 |
| READ 36123 | 3.5 | 6 | 0 | 0 | 0 | 2 | 2 | 0 | 0 | 0 |
| PGM 36124 | 6 | 8 | 0 | 0 | 0 | 0 | 5 | 0 | 0 | 0 |
| READ 36124 | 3.5 | 6 | 0 | 0 | 2 | 0 | 0 | 0 | 0 | 0 |
| PGM 36131 | 6 | 0 | 8 | 0 | 0 | 0 | 0 | 5 | 0 | 0 |
| READ 36131 | 3.5 | 0 | 6 | 0 | 0 | 0 | 0 | 0 | 2 | 2 |
| PGM 36132 | 8 | 0 | 6 | 0 | 0 | 0 | 0 | 5 | 5 | 0 |
| READ 36132 | 3.5 | 0 | 6 | 0 | 0 | 0 | 0 | 2 | 0 | 0 |
| PGM 36133 | 6 | 0 | 8 | 0 | 0 | 0 | 0 | 0 | 5 | 5 |
| READ 36133 | 6 | 0 | 3.5 | 0 | 0 | 0 | 0 | 0 | 2 | 2 |
| PGM 36134 | 8 | 0 | 6 | 0 | 0 | 0 | 0 | 0 | 5 | 5 |
| READ 36134 | 6 | 0 | 3.5 | 0 | 0 | 0 | 0 | 2 | 0 | 0 |
| PGM 36141 | 6 | 0 | 6 | 0 | 0 | 0 | 0 | 5 | 5 | 0 |
| READ 36141 | 8 | 0 | 3.5 | 0 | 0 | 0 | 0 | 0 | 0 | 2 |
| PGM 36142 | 6 | 0 | 6 | 0 | 0 | 0 | 0 | 5 | 5 | 0 |
| READ 36142 | 8 | 0 | 3.5 | 0 | 0 | 0 | 0 | 2 | 2 | 0 |
| PGM 36143 | 8 | 0 | 6 | 0 | 0 | 0 | 0 | 0 | 0 | 5 |
| READ 36143 | 3.5 | 0 | 6 | 0 | 0 | 0 | 0 | 0 | 0 | 2 |
| PGM 36144 | 6 | 0 | 8 | 0 | 0 | 0 | 0 | 0 | 0 | 5 |
| READ 36144 | 3.5 | 0 | 6 | 0 | 0 | 0 | 0 | 2 | 2 | 0 |

*FIG. 42*

ELECTRONIC DEVICE INCLUDING DISCONTINUOUS STORAGE ELEMENTS

CROSS-REFERENCE TO RELATED APPLICATIONS

This application is related to U.S. patent application Ser. No. 11/188,935 entitled "Process for Forming an Electronic Device Including Discontinuous Storage Elements" by Sadd et al. filed on Jul. 5, 2005, which is assigned to the current assignee hereof and incorporated herein by reference in its entirety.

BACKGROUND

1. Field of the Disclosure

The present invention relates to electronic devices and processes, and more particularly, to electronic devices that include discontinuous storage elements.

2. Description of the Related Art

Floating gate non-volatile memories ("FG NVM") are conventional and are used in many applications. The three most common types of programming mechanisms for FG NVM include Fowler-Nordheim tunneling, conventional hot carrier injection, and source-side injection. Fowler-Nordheim tunneling is efficient but is very slow. Efficiency can be measured by dividing the number of carriers that enter a floating gate or one or more other storage elements divided by the number of carriers that enter a memory cell having the floating or the other storage element(s). The latter number can be approximated by using the product of the programming current and the programming time.

Hot carrier injection can include conventional hot carrier injection and source-side injection. Both involve the generation of hot carriers, some of which are injected into the floating or the other storage element(s). In conventional hot carrier injection when using a floating gate, an electrical field is generated along a channel region of a memory cell. Within the channel region, the electrical field is the highest near the drain region. The electrical field accelerates carriers flowing within the channel region, such that, within the channel region, the carriers are traveling the fastest near the drain region. A small fraction of carriers collide with silicon or one or more other atoms within the channel region, redirecting the energetic carriers to the floating gate or other charge storage element(s). An electrical field generated by a control gate electrode can help inject some of that small fraction of the hot carriers into the floating gate. Conventional hot carrier injection is inefficient and has high programming current.

Source-side injection is a popular compromise, with respect to efficiency and programming current, between Fowler-Nordheim tunneling and conventional hot carrier injection. With source-side injection, hot carriers are still generated, however, most of the hot carriers are generated within a portion of the channel region that is spaced apart from the drain region. Memory cells designed to be programmed by source-side injection are not without problems. Typically, the memory cells require one or more additional critical lithographic sequences and result in larger memory cells.

High density floating gate memories are becoming more difficult to fabricate in commercial volumes. As the thickness of the gate dielectric layer decreases, the likelihood of a pinhole or other defect extending through the thickness of the gate dielectric layer increases. Such a defect can cause an electrical short or leakage path between the substrate and the floating gate. The electrical short or leakage path can affect the voltage on the floating gate, and therefore, the memory cell may not be able to retain data. One or more materials may be used for the gate dielectric layer instead of silicon dioxide, however, such material(s) may have other issues, such as material compatibility with other materials used in the memory cell, require new equipment, increase manufacturing costs, etc.

BRIEF DESCRIPTION OF THE DRAWINGS

The invention is illustrated by way of example and not limitation in the accompanying figures.

FIGS. 31 through 42 includes circuit schematic diagrams, cross-sectional views of exemplary physical embodiments of the circuit schematic diagrams, and operating voltage tables for memory cell along a row within an NVM array.

Figure 1:
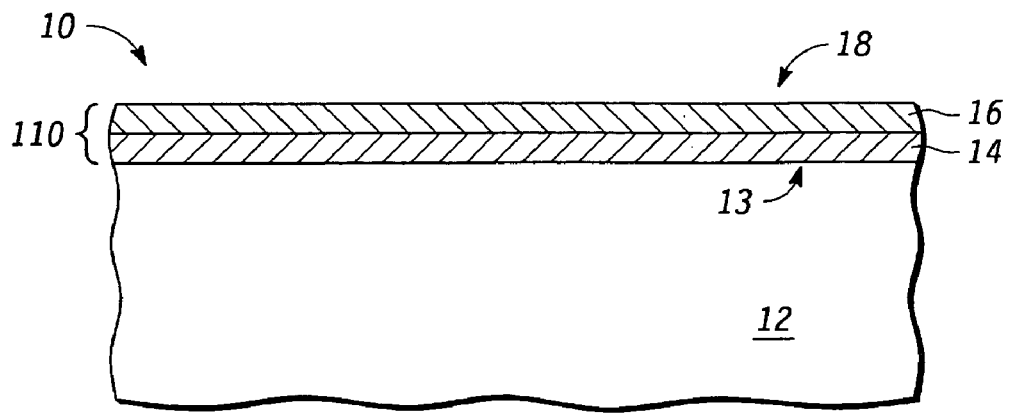
FIG. 1 includes an illustration of a cross-sectional view of a portion of a workpiece after formation of a protective layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include discontinuous storage elements that lie within a trench. The electronic device can include a substrate that includes a first trench. The trench can include a wall and a bottom and extends from a primary surface of the substrate. The electronic device can also include discontinuous storage elements, wherein a first portion of the discontinuous storage elements lie at least within the trench. The electronic device can further include a first gate electrode overlying the first portion of the discontinuous storage elements, wherein an upper surface of the first gate electrode lies below the primary surface of the substrate. The electronic device can also include a second gate electrode overlies the first gate electrode. In one embodiment, a second portion of the discontinuous storage elements that lie between the second gate electrode and the primary surface of the substrate. Embodiments described herein also include processes for forming the electronic device.

The electronic device can include a memory array in which bit lines, gate lines, or any combination thereof can take advantage of the trench design and buried bit lines. In one embodiment, a select gate line may be electrically connected to a different number of rows or columns of memory cells as compared to a control gate line. In a particular embodiment, a select gate line may be electrically connected to one row or one column of memory cells, and the control gate line may be electrically connected to two rows or two columns of memory cells. In another embodiment, a similar relationship may exist for bit lines. In still another embodiment, a select gate line and a control gate line may be substantially perpendicular to each other. The select gate line may be electrically connected to a different number of rows or columns of memory cells as compared to the control gate line. In a particular embodiment, a select gate line may be electrically connected to one row or one column of memory cells, and the control gate line may be electrically connected to two columns or two rows of memory cells.

Before addressing details of embodiments described below, some terms are defined or clarified. The term "discontinuous storage elements" is spaced-apart objects capable of storing a charge. In one embodiment, substantially all discontinuous storage elements may be initially formed and remain separate from one another. In another embodiment, a substantially continuous layer of material formed an later separated into discontinuous storage elements. In yet another embodiment, substantially all discontinuous storage elements may be initially formed separate from one another, and later during the formation, some but not all of the discontinuous storage elements may coalesce.

The term "primary surface" is intended to mean a surface of a substrate from which memory cells within a memory array are subsequently formed. The primary surface may be an original surface of a substrate before forming any electronic components or may be a surface from which trenches or other permanent structures within the memory array are formed. For example, the memory array may be formed at least partly within an epitaxial layer overlying a base material, and electronic components within peripheral area (outside the memory array) may be formed from the base material. In this example, the primary surface refers to the upper surface of the epitaxial layer, and not the original surface of the base material.

The term "stack" is intended to mean a plurality of layers or a plurality of at least one layer and at least one structure (e.g., nanocrystals), wherein the plurality of layers or plurality of layer(s) and structure(s) provides an electronic function. For example, a non-volatile memory stack can include layers used to form at least part of a non-volatile memory cell. A stack may be part of a larger stack. For example, a non-volatile memory stack can include a charge storage stack that is used to store charge within a non-volatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIG. 1 includes a cross-sectional view of a portion of electronic device 10, such as an integrated circuit. The integrated circuit can be a standalone memory, a microcontroller, or other integrated circuit that includes a memory. In one embodiment, electronic device 10 can include non-volatile memory ("NVM") array 18, a portion of which is illustrated in FIG. 1. Substrate 12 can include a monocrystalline semiconductor wafer, a semiconductor-on-insulator wafer, a flat panel display (e.g., a silicon layer over a glass plate), or other substrate conventionally used to form electronic devices. Although not illustrated, shallow trench field isolation may be formed over portions of substrate 12 in peripheral areas, which are outside NVM array 18. Optionally, the doping concentration of substrate 12 along primary surface 13 within NVM array 18 can be increased using a conventional doping operation to potentially reduce leakage current between subsequently-formed gate electrodes that may overlie portions of primary surface 13. Protective layer 110 can be formed over substrate 12. Protective layer 110 can include pad layer 14, overlying substrate 12 and oxidation-resistant layer 16, over pad layer 14. Protective layer 110 could have more or fewer layers than are illustrated. The upper most surface of substrate 12, illustrated as contacting pad layer 14, is primary surface 13. Protective layer 110 can remain over the peripheral areas until fabrication of NVM array 18 is substantially completed. In one embodiment, pad layer 14 includes oxide, and oxidation-resistant layer 16 includes nitride.

Figure 2:
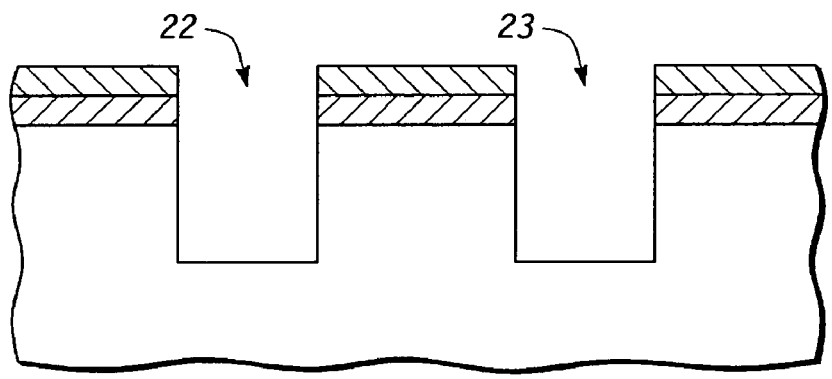
FIG. 2 includes an illustration of a cross-sectional view of the workpiece of FIG. 1 after formation of trenches.

A patterned resist layer (not illustrated), which includes openings at locations within NVM array 18 where trenches are to be formed, is formed over substrate 12 by a conventional technique. Exposed portions of protective layer 110 can then be removed by a conventional technique to expose primary surface 13. In one embodiment, trenches 22 and 23, as illustrated in FIG. 2, are formed prior to removal of the patterned resist layer. In another embodiment, the patterned resist layer is then removed, and trenches 22 and 23 can then be formed by a conventional technique. Trenches 22 and 23 are spaced apart from each other, extend from primary surface 13, and include walls and bottoms. The depth of trenches 22 and 23 can, at least in part, determine the channel length of one or more of the memory cells being formed adjacent to trenches 22 and 23. In one embodiment, the depths of trenches 22 and 23 are in a range of approximately 50 to approximately 500 nm. In one particular embodiment, trenches 22 and 23 are formed using a timed anisotropic etch to produce substantially vertical walls. In one embodiment, trenches 22 and 23 have substantially uniform depths.

Figure 3:
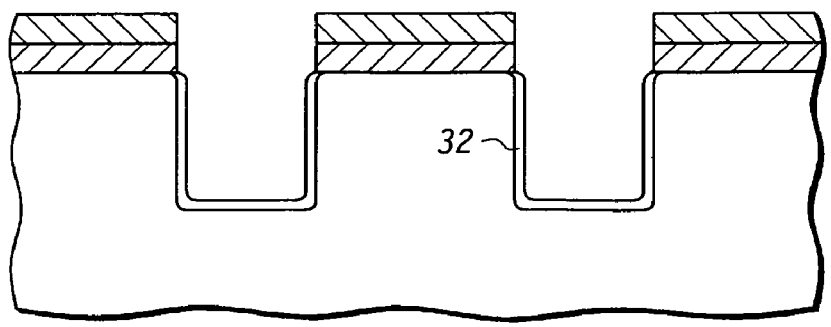
FIG. 3 includes an illustration of a cross-sectional view of a workpiece of FIG. 2 after formation of an insulating layer within the trenches.

Insulating layer 32 is formed along the exposed surfaces of trenches 22 and 23, as illustrated in FIG. 3. Insulating layer 32 may or may not be substantially conformal. In one embodiment, insulating layer 32 may include an oxide, a nitride, an oxynitride, or a combination thereof. In one embodiment, insulating layer 32 can be used as an implant screen. In one particular embodiment, insulating layer 32 is formed by thermally oxidizing the exposed portions of substrate 12 within trenches 22 and 23. Thermal oxidation can be beneficial in removing defects, such as those induced by etching, help to round corners of trenches 22 and 23, or a combination thereof. In another embodiment (not illustrated), insulating layer 32 can be deposited. A deposited insulating layer 32 would cover substantially all exposed surfaces of the workpiece.

Figure 4:
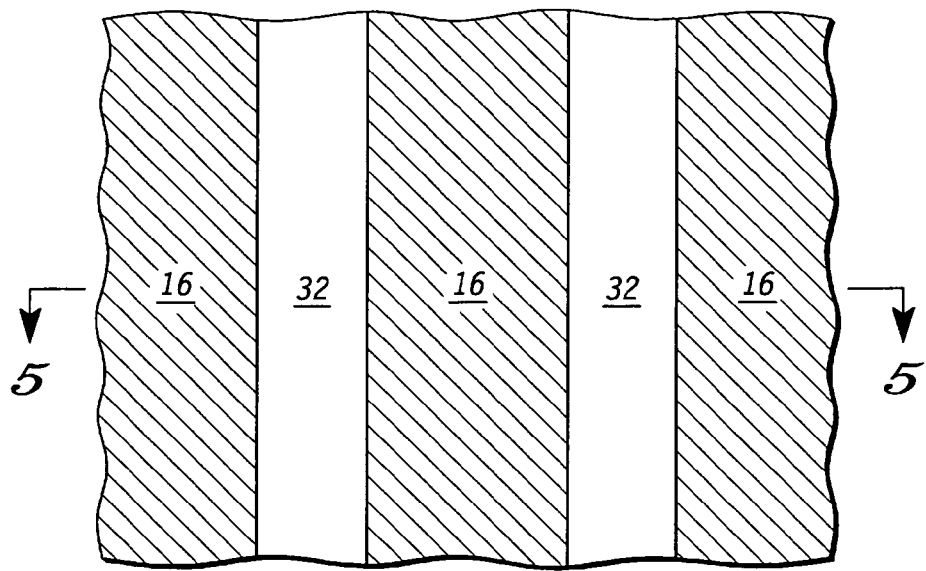
FIGS. 4 and 5 include illustrations of a top view and a cross-sectional view, respectively, of the workpiece of FIG. 3 after formation of doped regions at the bottom the trenches.
Figure 5:
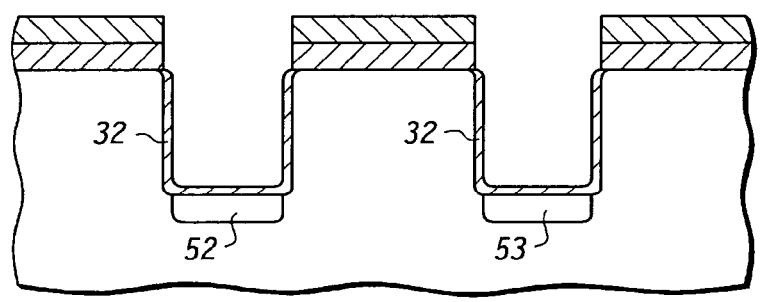

A dopant is introduced into portions of substrate 12 at the bottom of trenches 22 and 23 to form doped regions 52 and 53, as illustrated in top and cross-sectional views, in FIGS. 4 and 5, respectively. Doped region 52 lies within substrate 12 and below trench 22, and doped region 53 lies within substrate 12 and below trench 23. Doped regions 52 and 53 can be source/drain ("S/D") regions and act as buried bit lines. The dopant may be a p-type dopant (e.g., boron) or an n-type dopant (e.g., phosphorus or arsenic). In one embodiment, the dopant can be introduced using ion implantation. An optional thermal cycle can be performed to activate the dopant. In another embodiment, subsequent processing may have one or more thermal cycles capable of activating the dopant. At the bottom of trenches 22 and 23, the doping concentration of doped regions 52 and 53 is at least approximately 1E19 atoms/cm$^3$.

Figure 6:
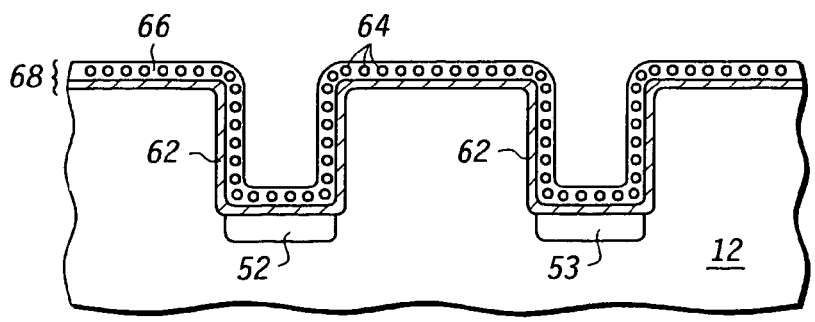
FIG. 6 includes an illustration of a cross-sectional view of the workpiece of FIG. 5 after formation of a charge storage stack including discontinuous storage elements.

The remaining portions of protective layer 110 within NVM array 18 are removed by conventional techniques. Charge storage stack 68, including dielectric layer 62, discontinuous storage elements 64, and dielectric layer 66, can then be formed, as illustrated in FIG. 6. In one embodiment, insulating layer 32 can be removed prior to formation of dielectric layer 62 over the exposed surface of trenches 22 and 23, including the walls and bottoms of trenches 22 and 23. In another embodiment, insulating layer 32 is used in place of or in conjunction with dielectric layer 62. Dielectric layer 62 may be thermally grown using an oxidizing or nitridizing ambient, or deposited using a conventional chemical vapor deposition technique, physical vapor deposition technique, atomic layer deposition technique, or a combination thereof. Dielectric layer 62 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. Dielectric layer 62 has a thickness in a range of approximately 1 to approximately 10 nm. The thickness and material selection of dielectric layer 62 will substantially determine its electrical properties. In one embodiment the thickness and material are chosen such that dielectric layer 62 has a silicon dioxide equivalent thickness of less than 10 nm.

Discontinuous storage elements 64 are then formed over NVM array 18. In one embodiment, one portion of discontinuous storage elements 64 lie at least within trench 22, and another portion of discontinuous storage elements 64 lie at least within trench 23. The individual discontinuous storage elements 64 are substantially physically separated from each other. Discontinuous storage elements 64 can include a material capable of storing a charge, such as silicon, a nitride, a metal-containing material, another suitable material capable of storing charge, or any combination thereof. For example, discontinuous storage elements 64 can include silicon nanocrystals or metal nanoclusters. In one particular embodiment, a substantially continuous layer of amorphous silicon can be formed over exposed surfaces of substrate 12. The substantially continuous layer can be exposed to heat or other processing conditions that can cause the layer to "ball up" or otherwise form silicon nanocrystals. Discontinuous storage elements 64 may be undoped, doped during deposition, or doped after deposition. In one embodiment, discontinuous storage elements 64 can be formed from one or more materials whose properties are not significantly adversely affected during a thermal oxidation process. Such a material can include platinum, palladium, iridium, osmium, ruthenium, rhenium, indium-tin, indium-zinc, aluminum-tin, or any combination thereof. Each of such materials, other than platinum and palladium, may form a conductive metal oxide. In one embodiment, each of discontinuous storage elements 64 is no greater than approximately 10 nm in any dimension. In another embodiment, discontinuous storage elements 64 can be larger, however, discontinuous storage elements 64 are not formed so large as to form a continuous structure (i.e., all discontinuous storage elements 64 are not fused together).

Dielectric layer 66 is then formed over discontinuous storage elements 64. Dielectric layer 66 can include one or more dielectric films, any of which may be thermally grown or deposited. Dielectric layer 66 can include any one or more materials or be formed using any of the embodiments as described with respect to dielectric 62 layer. Dielectric layer 66 can have the same or different composition compared to dielectric 62 layer and may be formed using the same or different formation technique compared to dielectric layer 62.

Figure 7:
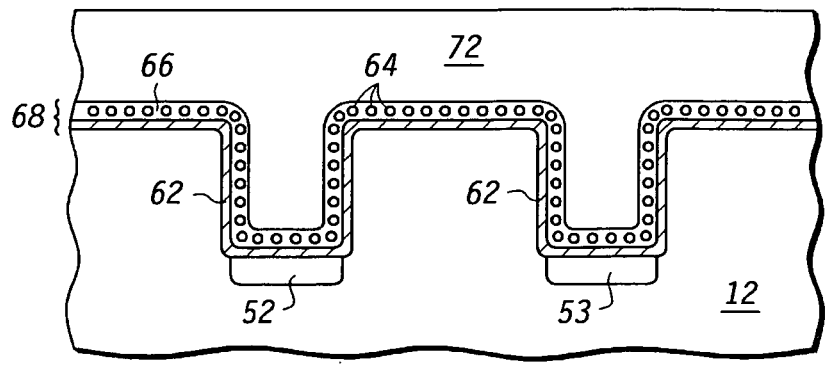
FIG. 7 includes an illustration of a cross-sectional view of the workpiece of FIG. 6 after formation of a conductive layer over the substrate.

Conductive layer 72 is then formed overlying the workpiece, as illustrated in FIG. 7. Conductive layer 72 can include one or more semiconductor-containing or metal-containing films. In one embodiment, conductive layer 72 includes polysilicon or amorphous silicon deposited by a chemical vapor deposition process. In another embodiment, conductive layer 72 may include one or more other materials or may be deposited by another process. In one particular embodiment, conductive layer 72 is doped when deposited, and in another particular embodiment, is doped after it is deposited. The thickness of conductive layer 72 is sufficient to at least substantially fill in the trenches within NVM array 18. In one embodiment, the thickness of conductive layer 72 is in a range of approximately 50 to approximately 500 nm, and in a finished device, remaining portions of conductive layer 72 have a dopant concentration of at least 1E19 atoms/cm$^3$ when conductive layer 72 includes polysilicon or amorphous silicon.

Figure 8:
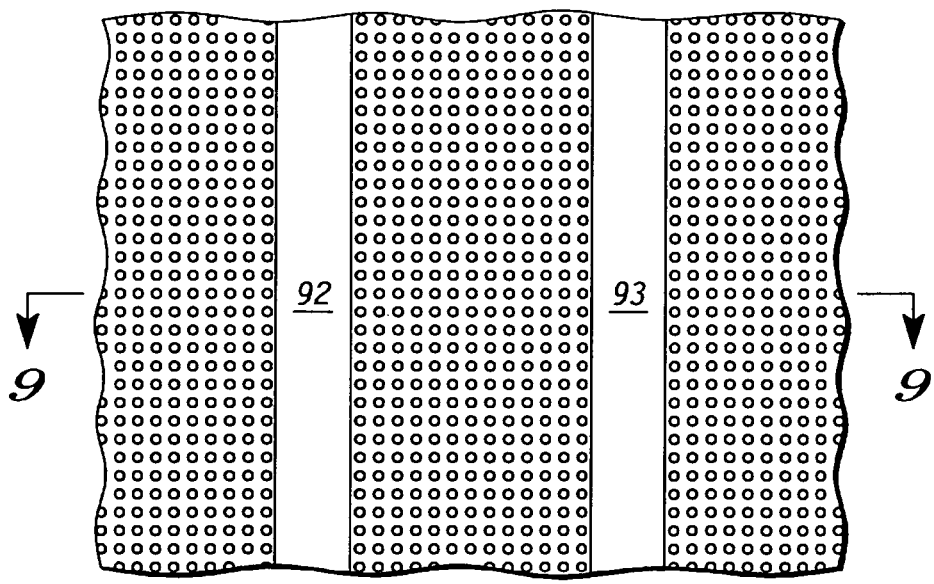
FIGS. 8 and 9 include illustrations of a top view and a cross-sectional view, respectively, of the workpiece in FIG. 7 after formation of gate electrodes.
Figure 9:
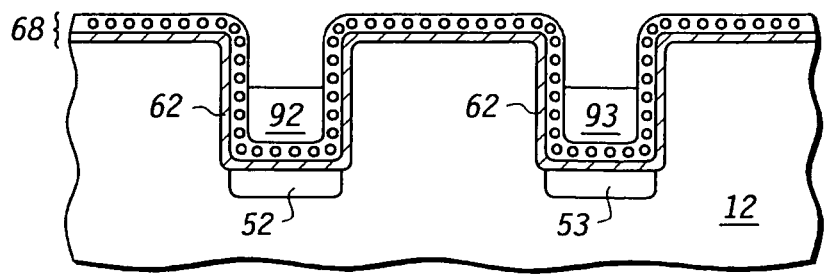

Portions of conducting layer 72 overlying primary surface 13 and lying outside trenches 22 and 23 can be removed, as illustrated in FIGS. 8 and 9. In FIG. 8 and other top views, some dielectric or insulating layers are not illustrated to simplify understanding of positional relationships between features within NVM array 18. Additional portions of conductive layer 72 are removed such that the remaining material is recessed below primary surface 13 and contained within trenches 22 and 23 to form gate electrodes 92 and 93, each of which has an upper surface that lies below primary surface 13. Gate electrode 92 overlies one portion of discontinuous storage elements 64 within trench 22, and gate electrode 93 overlies another portion of discontinuous storage elements 64 within trench 23. In one embodiment, each of gate electrodes 92 and 93 has a substantially rectangular shape, as seen from a cross-sectional view. In one particular embodiment, conductive layer 72 is undoped polysilicon, as initially deposited. Gate electrodes 92 and 93 are then doped by conventional techniques such that in a finished device, gate electrodes 92 and 93 have a concentration of at least 1E9 atoms/cm$^3$. In another embodiment, a material capable of reacting with silicon to form a silicide, and can include Ti, Ta, Co, W, Mo, Zr, Pt, other suitable material, or any combination thereof is formed on gate electrodes 92 and 93 and reacted to form a metal silicide.

In one particular embodiment, removal of a portion of conductive layer 72 is accomplished by polishing with a conventional technique, followed by a timed etch. In another embodiment (not illustrated), the removal is accomplished by an etch process without polishing. In another embodiment the recess, which is the elevational difference between the primary surface 13 and the tops of the gate electrodes 92 and 93, is between 20% and 80% of the depth of trenches 22 and 23.

Figure 10:
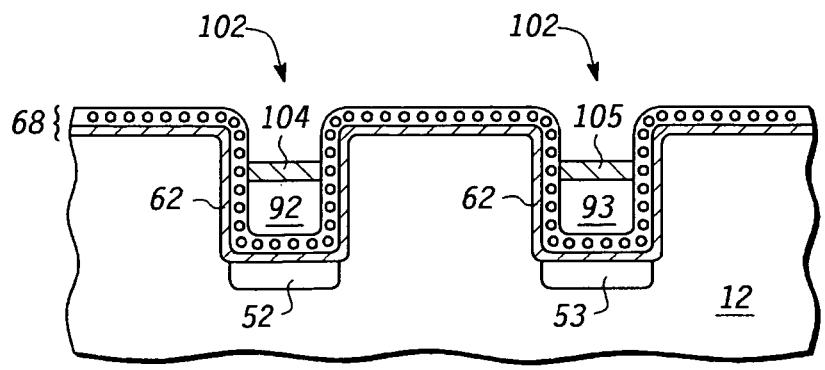
FIG. 10 includes an illustration of a cross-sectional view of the workpiece of FIGS. 8 and 9 after formation of a dielectric layer.

An insulating layer including gate dielectric portions 102 and intergate dielectric portions 104 and 105 is then formed over NVM array 18, as illustrated in FIG. 10. The insulating layer can include one or more dielectric films, any of which may be thermally grown or deposited. The insulating layer can include any one or more materials or be formed using any of the embodiments as described with respect to dielectric 62 layer. The insulating layer can have the same or different composition compared to dielectric 62 layer and may be formed using the same or different formation technique compared to dielectric layer 62. The thickness of intergate dielectric portions 104 and 105 can affect the electrical fields within the channel regions of the memory cells. The electrical field is designed to provide the highest change in electrical field within the channel region for each memory cell to allow for source-side injection. In one embodiment, the thickness of intergate dielectric portions 104 and 105 is in a range of approximately 10 to approximately 30 nm.

Figure 11:
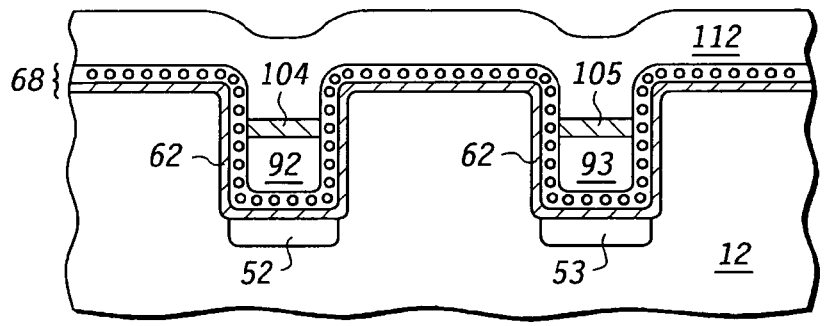
FIG. 11 includes an illustration of a cross-sectional view of the workpiece of FIG. 10 after formation of a conducting layer.

Conductive layer 112 is formed over NVM array 18, as illustrated in FIG. 11. Conductive layer 112 can include one or more semiconductor-containing or metal-containing films. In one embodiment, conductive layer 112 is doped polysilicon. In another embodiment, conductive layer 112 is formed from a metal containing material. In one embodiment, the thickness of conductive layer 112 is in a range of approximately 20 to approximately 300 nm. In another embodiment, conductive layer 112 has a dopant concentration of at least approximately 1E19 atoms/cm$^3$ when conductive layer 112 includes polysilicon or amorphous silicon.

Figure 12:
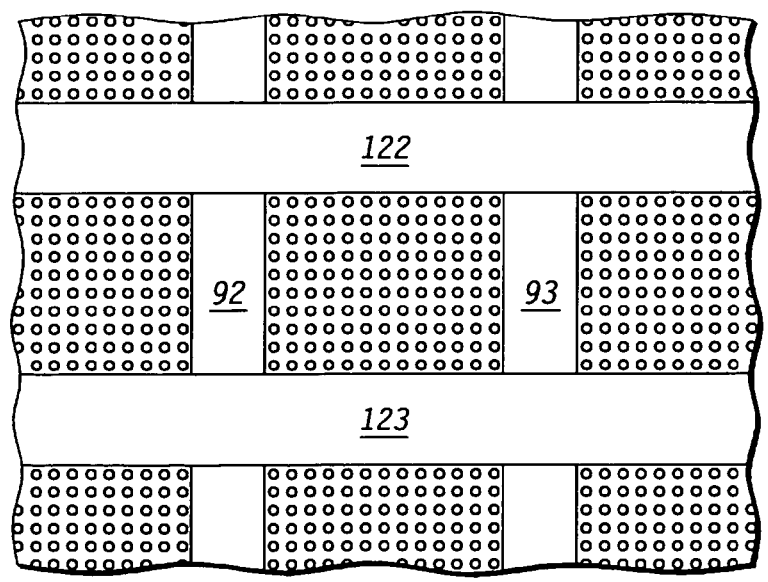
FIG. 12 includes an illustration of a top view of the workpiece of FIG. 11 after formation of conductive lines.

Conductive layer 112 is patterned by etching using a conventional technique to form conductive lines 122 and 123, which include gate electrodes, as illustrated in FIG. 12. Conductive lines 122 and 123 can lie at least partly within trench 22, trench 23, one or more other trenches (not illustrated) within NVM array 18, or any combination thereof. In one embodiment, the lengths of conductive lines 122 and 123 are substantially perpendicular to the lengths of trenches 22 and 23 within NVM array 18. Optionally, a material capable of reacting with silicon to form a silicide (e.g., Ti, Ta, Co, W, Mo, Zr, Pt, other suitable material, or any combination thereof) is formed on conductive line 122 and 123 and reacted to form a metal silicide. In another embodiment, conductive lines 122 and 123 can be used as word lines for NVM array 18, with portions thereof acting as gate electrodes for plurality of bit cells. Optionally, sidewall spacers may be formed adjacent to conductive lines 122 and 123.

In one embodiment, NVM array 18 is substantially complete. Peripheral electrical connections (not illustrated) are made to access conductive portions of NVM array 18. Protective layer 110 overlying the peripheral areas of substrate 12 can be removed, and another protective layer (not illustrated) can be formed over NVM array 18, which may protect NVM array 18 during component fabrication within the peripheral areas. Processing can be continued to form a substantially completed electronic device. One or more insulating layers, one or more conductive layers, and one or more encapsulating layers are formed using one or more conventional techniques.

In another embodiment, a different NVM array 18 layout and interconnect scheme may be used. In this embodiment, the process through formation of conductive layer 112 over all of NVM array 18 (FIG. 11) can be performed using any embodiment as previously described.

Figure 13:
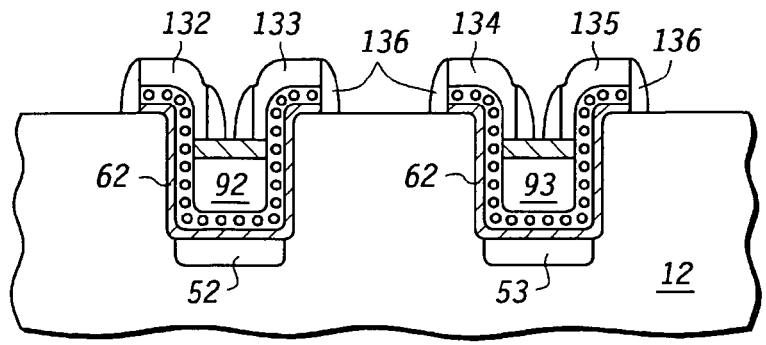
FIG. 13 includes an illustration of a cross-sectional view of the workpiece of FIG. 10 after formation of conducting lines in accordance with an alternative embodiment.

Conductive layer 112 can be patterned and etched to form conductive lines 132 through 135, as illustrated in FIG. 13. The conductive lines 132 through 135 can act as word lines in the NVM array 18. The lengths of conductive lines 132 through 135 are substantially parallel to the lengths of trenches 22 and 23. In one embodiment, portions of conductive lines 132 through 135 can lie within the recesses of trenches 22 and 23. The composition and method of formation of conductive lines 132 through 135 may be any of those described with respect to formation of conductive lines 122 through 123. Exposed portions of charge storage stack 68, including discontinuous storage elements 64, that overlie primary surface 13 can be removed using a conventional technique. In one embodiment, an insulating layer (not illustrated) can be grown or deposited over primary surface 13 of substrate 12 and along exposed surfaces of conductive lines 132 through 135. The insulating layer can help to protect sidewalls of conductive lines 132 through 135 and act as an implant screen during a subsequent doping operation to form source/drain regions along primary surface 13 and outside trenches 22 and 23. Optionally, sidewall spacers 136 may be formed adjacent to conductive lines 132 through 135.

Figure 14:
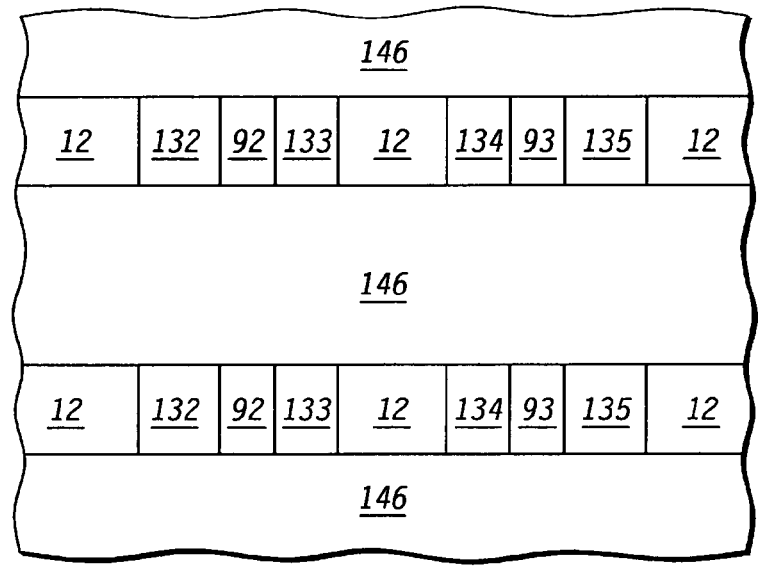
FIG. 14 includes an illustration of a top view of the workpiece of FIG. 13 after formation of an implant masking layer.
Figure 15:
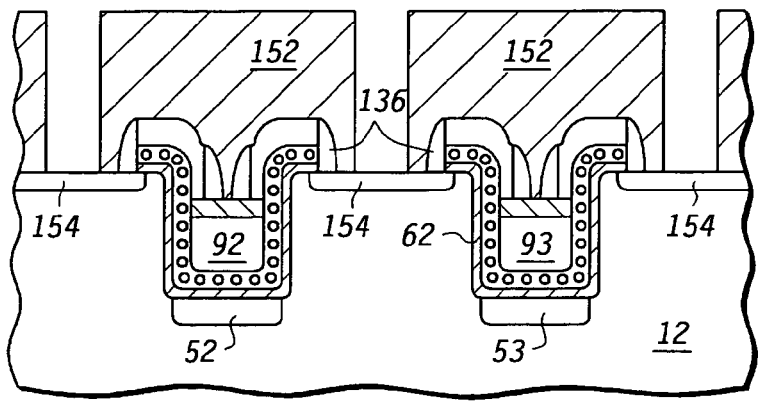
FIG. 15 includes an illustration of a cross-sectional view of the workpiece of FIG. 14 after formation of an insulating layer with contact openings.

Patterned resist layer 146, as illustrated in FIG. 14, is formed over the workpiece to expose portions of conductive lines 132 through 135 and portions of the insulating layer (not illustrated in FIG. 15). In one embodiment, openings in patterned resist layer 146 substantially correspond to locations over which bit lines will subsequently be formed. A dopant is introduced into portions of substrate 12 to form doped regions 154, as illustrated in FIG. 15. The dopant may be a p-type dopant (e.g., boron) or an n-type dopant (e.g., phosphorus or arsenic). In one embodiment, the dopant can be introduced using ion implantation. Patterned resist layer 146 is then removed by a conventional technique. In one embodiment, the implanted dopant is activated by one or more subsequent thermal cycles, which may or may not serve a different primary purpose such as oxidation, deposition, annealing, drive or activation of a different implant dopant. In one embodiment, each of doped regions 154 has a dopant concentration of at least approximately $1E19$ atoms/cm$^3$. In a particular embodiment, in a finished device, doped regions 154 serve as S/D regions.

In one embodiment, NVM array 18 is now substantially complete other than electrical connections. Remaining portions of protective layer 110 (not illustrated in FIG. 15) that overlie the peripheral areas of substrate 12 are removed, and another protective layer (not illustrated) can be formed over NVM array 18 which may protect NVM array 18 during component fabrication within the peripheral areas. Component fabrication within the peripheral areas can be performed using one or more conventional techniques. After the component fabrication within the peripheral areas is substantially completed, the protective layer overlying NVM array 18 can be removed.

Figure 16:
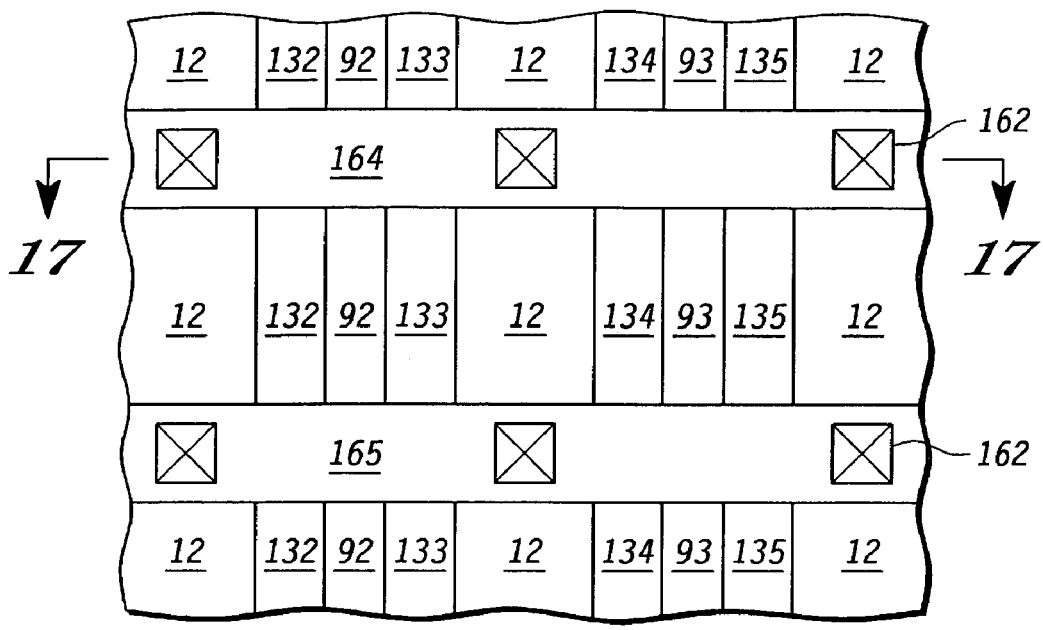
FIGS. 16 and 17 include illustrations of a top view and a cross-sectional view, respectively, of the workpiece of FIG. 15 after fabrication of an electronic device is substantially completed.
Figure 17:
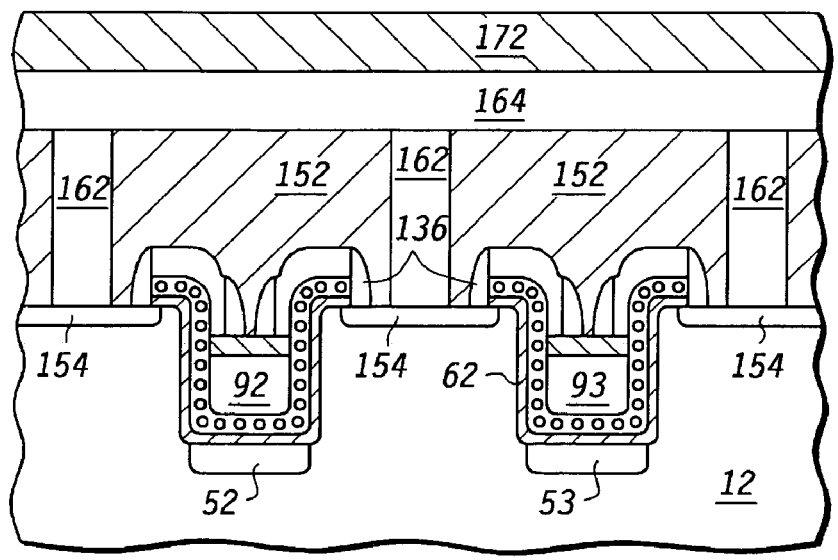

Processing is continued to form the substantially completed electronic device, as illustrated in FIGS. 16 and 17. Referring to FIG. 15, an interlevel dielectric layer 152 is formed over the workpiece by a conventional technique. Interlevel dielectric layer 152 is patterned to form contact openings that extend to doped regions 154 and to other portions of NVM array 18 that are not illustrated in FIG. 15. Interlevel dielectric layer 152 can include an insulating material, such as an oxide, a nitride, an oxynitride, or a combination thereof. In a specific embodiment, an anisotropic etch can be used to form contact openings.

Conductive plugs 162 and conductive lines 164 and 165 are then formed, as illustrated in FIGS. 16 and 17. The lengths of conductive lines 164 and 165 are substantially perpendicular to the lengths of conductive lines 132 through 135, as illustrated in FIG. 16. In one embodiment, conductive lines 164 and 165 are bit lines for NVM array 18, and conductive plugs 162 are bit line contacts. Referring to FIG. 16, portions of substrate 12 are illustrated lying between conductive lines 164 and 165. Although not illustrated in FIG. 16, doped regions 154 underlie conductive lines 164 and 165 between portions of substrate 12.

In one embodiment, conductive plugs 162 are formed prior to conductive lines 164 and 165. In one particular embodiment, a conductive layer (not illustrated) is formed over interlevel dielectric layer 152 and substantially fills contact openings therein. Portions of the conductive layer that lie outside the contact openings are removed to form conductive plugs 162. In one embodiment, a conventional chemical-mechanical polishing operation can be performed, and in another embodiment, a conventional etching process can be performed.

Another insulating layer (not illustrated) is then deposited and patterned to form trenches where conductive lines 164 and 165 will subsequently be formed. Other trenches can be formed at locations within NVM array 18, outside NVM array 18, or a combination thereof. In one embodiment, another conductive layer is formed over interlevel dielectric layer 152 and substantially fills the trenches in the insulating layer. Portions of the conductive layer that lie outside the trenches within the insulating layer are removed to form conductive lines 164 and 165. In one embodiment, a conventional chemical-mechanical polishing operation can be performed, and in another embodiment, a conventional etching process can be performed. Although not illustrated in FIGS. 16 and 17, the insulating layer can lie at substantially the same elevation between conductive lines 164 and 165. In another embodiment (not illustrated), conductive plugs 162 and conductive lines 164 and 165 are formed concurrently using a conventional dual-inlaid process.

Conductive plugs 162 and conductive lines 164 and 165 can include the same or different conducting materials. Each of conductive plugs 162 and conductive lines 164 and 165 can include doped silicon, tungsten, titanium, tantalum, titanium nitride, tantalum nitride, aluminum, copper, another suitable conductive material, or any combination thereof. In one particular embodiment, conductive plugs 162 include tungsten, and conductive lines 164 and 165 include copper. An optional barrier layer, adhesion layer, or a combination thereof may be formed before the corresponding conductive layers (e.g., tungsten for conductive plugs 162 and copper for conductive lines 164 and 165). An optional capping layer (e.g., a metal-containing nitride) may be used to encapsulate copper within conductive lines 164 and 165.

In another embodiment (not illustrated), additional insulating and conductive layers can be formed and patterned to form one or more additional levels of interconnects. After the last interconnect level has been formed, passivation layer 172 is formed over substrate 12, including NVM array 18 and peripheral areas. Passivation layer 172 can include one or more insulating film, such as an oxide, a nitride, an oxynitride, or a combination thereof.

In another embodiment, yet another NVM array 18 layout and interconnect scheme may be used. In this embodiment, the process through formation of conductive lines 122 and 123 (FIG. 12) can be performed using any embodiment as previously described with respect to FIGS. 1 to 12. In one embodiment, remaining portions (not illustrated) of protective layer 110 that overlie the peripheral areas of substrate 12 are removed, and another protective layer (not illustrated) can be formed over NVM array 18 which may protect NVM array 18 during component fabrication within the peripheral areas. Component fabrication within the peripheral areas can be performed using one or more conventional techniques. After the component fabrication within the peripheral areas is substantially completed, the protective layer overlying NVM array 18 can be removed. In one embodiment, the exposed portions of charge storage stack 68 can also be removed.

Figure 18:
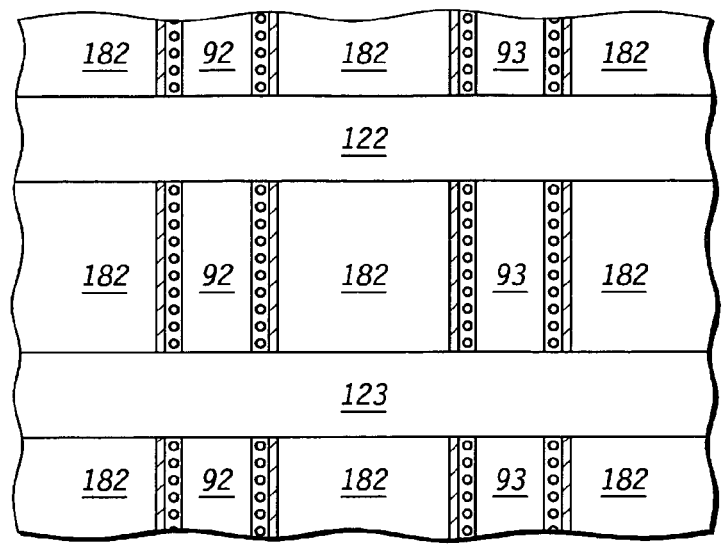
FIG. 18 includes an illustration of a top view of the workpiece of FIG. 12 after formation of doped regions within the substrate.

In one embodiment, the remainder of processing for the peripheral areas and NVM array 18 can occur substantially simultaneously. After forming conductive lines 122 and 123 and other conductive lines that include gate electrodes in NVM array 18 and peripheral areas, a dopant is introduced into substrate 12 to form doped region 182 at locations between conductive lines 122 and 123 and outside and adjacent to trenches 22 and 23, as illustrated in FIG. 18. Doped region 182 can include any one or more materials or be formed using any of the embodiments as described with respect to doped region 154. Doped region 182 can have the same or different composition compared to doped region 154 and may be formed using the same or different formation technique compared to doped region 154. Optionally, spacers (not illustrated) may be formed adjacent to conductive lines 122 and 123 before, after, or between individual actions used in forming doped region 182. In one specific embodiment, the optional sidewall spacers can be formed as previously described regarding other embodiments. In one embodiment, doped region 182 can serve as S/D regions in the finished device. In a particular embodiment, doped region 182 has a dopant concentration of at least approximately $1E19$ atoms/ $cm^3$. Optionally, a metal silicide can be formed from portions of conductive lines 122 and 123, doped region 182, or any combination thereof, using a conventional technique.

Figure 19:
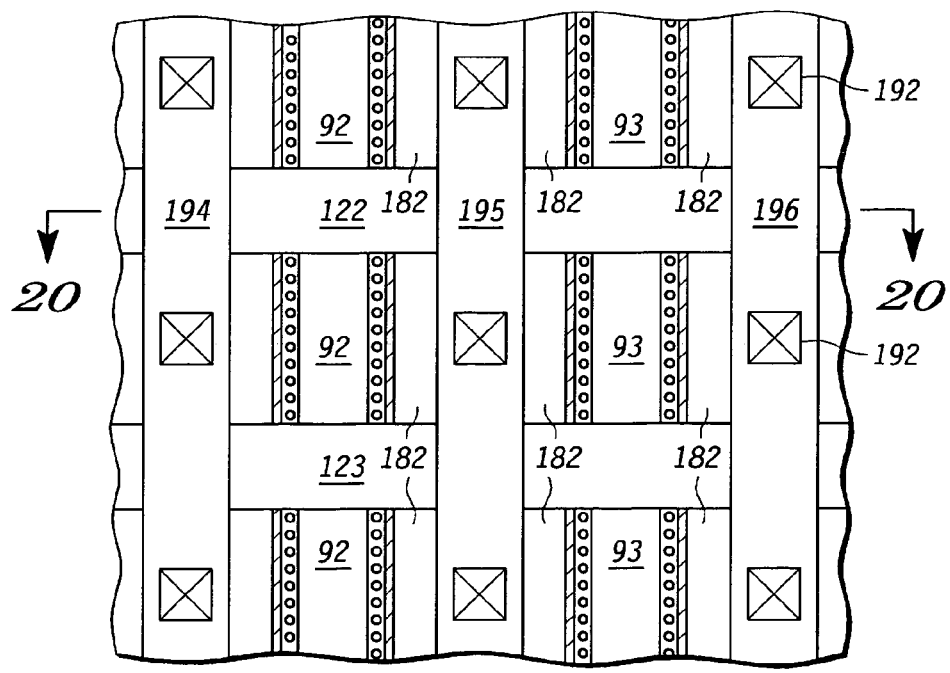
FIGS. 19 and 20 include illustrations of a top view and a cross-sectional view, respectively, of the workpiece of FIG. 18 after fabrication of an electronic device is substantially completed.
Figure 20:
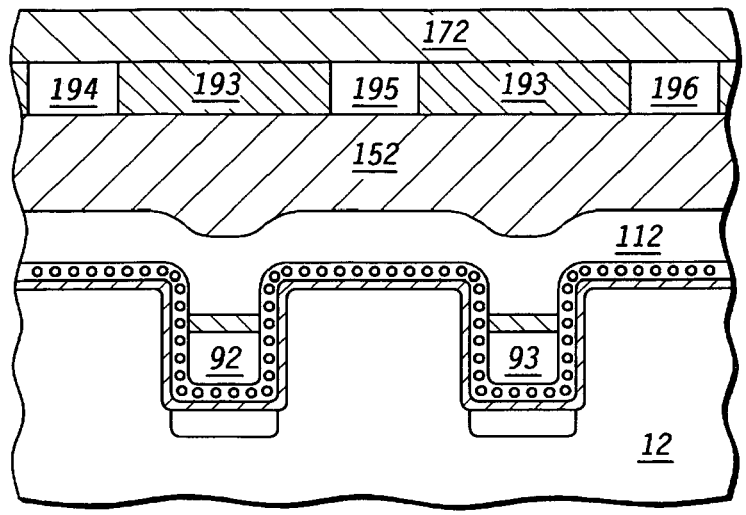

Interlevel dielectric layer 152 is then formed and patterned to form contact openings, as illustrated in FIGS. 19 and 20, using any of the embodiments as previously described with respect to formation and patterning of interlevel dielectric layer 152. The locations of the contact openings are changed as compared to a prior embodiment in that contact openings extend to doped regions 182.

Referring to FIGS. 19 and 20, interlevel dielectric layer 152 can be formed as previously described. Conductive plugs 192 are then formed using any embodiment as previously described for conductive plugs 162. The locations of conductive plugs 192 are different from those illustrated for conductive plugs 162.

Referring to FIGS. 19 and 20, insulating layer 193 is then deposited over interlevel dielectric layer 152 and conductive plugs 192 and patterned to form trenches where conductive lines 194 through 196 will subsequently be formed. Other trenches can be formed at locations within NVM array 18, outside NVM array 18, or a combination thereof.

Conductive lines 194 through 196 are then formed using any embodiment as previously described for conductive lines 164 and 165. Conductive lines 194 through 196 can serve as bit lines within NVM array 18. The locations of conductive plugs 192 and conductive lines 194 through 196 are different from those illustrated for conductive plugs 162 and conductive lines 164 and 165, respectively. The orientation of conductive lines 194 through 196 is different from the orientation of conductive lines 164 and 165. The lengths of conductive lines 194 through 196 are substantially perpendicular to the lengths of conductive lines 132 and 133, as illustrated in FIG. 19.

In another embodiment (not illustrated), additional insulating and conductive layers can be formed and patterned to form additional levels of interconnects. After the last interconnect level has been formed, passivation layer 172 is formed over substrate 12, including NVM array 18 and peripheral areas. Passivation layer 172 can include one or more insulating film, such as an oxide, a nitride, an oxynitride, or a combination thereof.

In another embodiment, still another NVM array 18 layout and interconnect scheme may be used. The layout and interconnect scheme is similar to an embodiment as illustrated in FIGS. 1 through 13 and 18 through 20 except that a virtual ground array architecture is used, rather than conductive lines 194 through 196. The layout and organization will become more apparent after reading the description below with respect to FIGS. 21 to 25.

Figure 21:
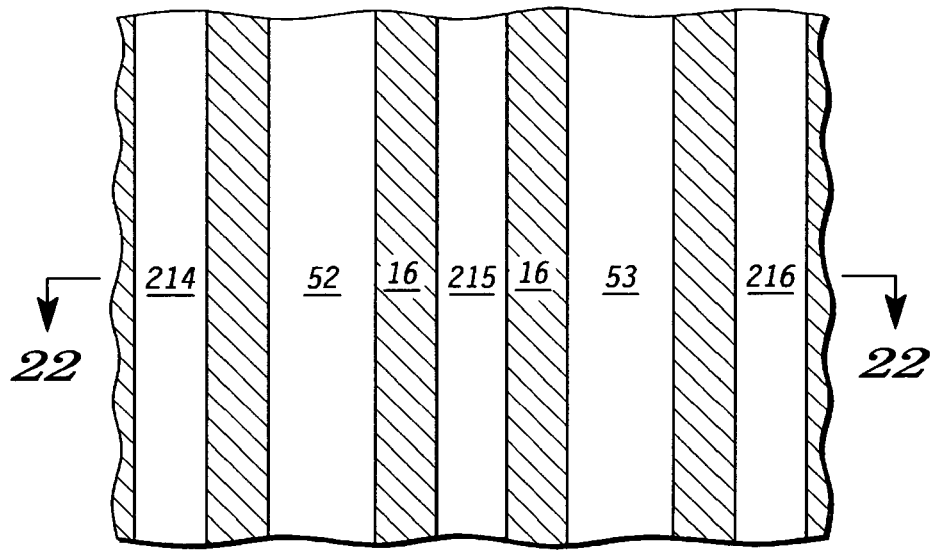
FIGS. 21 and 22 include illustrations of a top view and a cross-sectional view, respectively, of the workpiece of FIG. 13 after formation of doped regions within the substrate.
Figure 22:
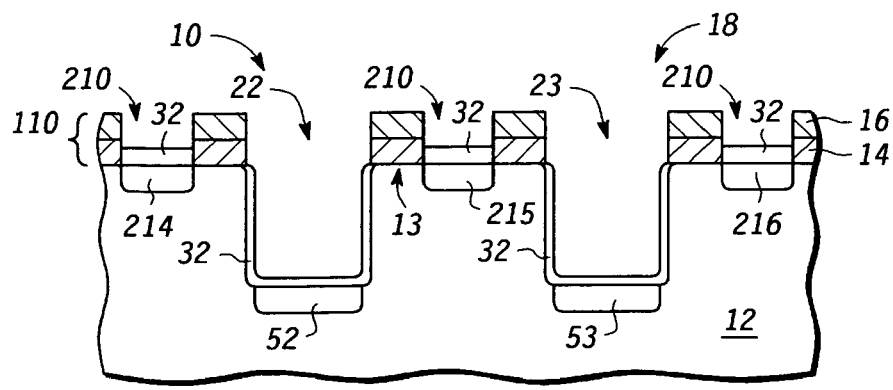

Relatively early in the process, openings 210 are formed within the protective layer 110, and doped regions 214, 215, and 216 are formed along primary substrate 13 of substrate 12 outside trenches 22 and 23, as illustrated in FIGS. 21 and 22, which are similar to FIGS. 4 and 5, respectively. Openings 210 and doped regions 214, 215, and 216 can be formed using one or more conventional techniques. Openings 210 can be formed before or after forming trenches 22 and 23. For example, all openings within protective layer 110 may be formed at substantially simultaneously. A mask (not illustrated) can be formed over opening 210 to substantially prevent forming a trench below openings 210. The mask can be removed after forming trenches 22 and 23. In another embodiment, a different mask (not illustrated) may be formed over openings 210 after trenches 22 and 23 have been formed, and the different mask can be removed after forming openings 210. Insulating layer 32 can be formed along the bottoms of openings 210 in a manner similar to the embodiment described with respect to FIG. 3.

Doped regions 214, 215, and 216 can be formed using any one or more of the embodiments as described with respect to doped regions 52 and 53. The dopant species, concentration, and profile and formation of doped regions 214, 215, and 216 may be the same or different as compared to doped regions 52 and 53. In one embodiment, doped regions 214, 215, and 216 can be formed substantially simultaneously with doped regions 52 and 53. Each of doped regions 52, 53, 214, 215, and 216 have lengths that are substantially parallel to one another and can act as buried bit lines. Doped regions 52 and 53 lie at elevations deeper within substrate 12, as compared to doped regions 214, 215, and 216.

In still another embodiment (not illustrated), openings 210 are not formed. Instead, after forming trenches 22 and 23, remaining portions of protective layer 110 within NVM array 18 are removed before forming insulating layer 32. Doped regions 214, 215, and 216 can be formed when doped regions 52 and 53 are formed. Doped regions 214, 215, and 216 can extend to walls of trenches 22 and 23.

Figure 23:
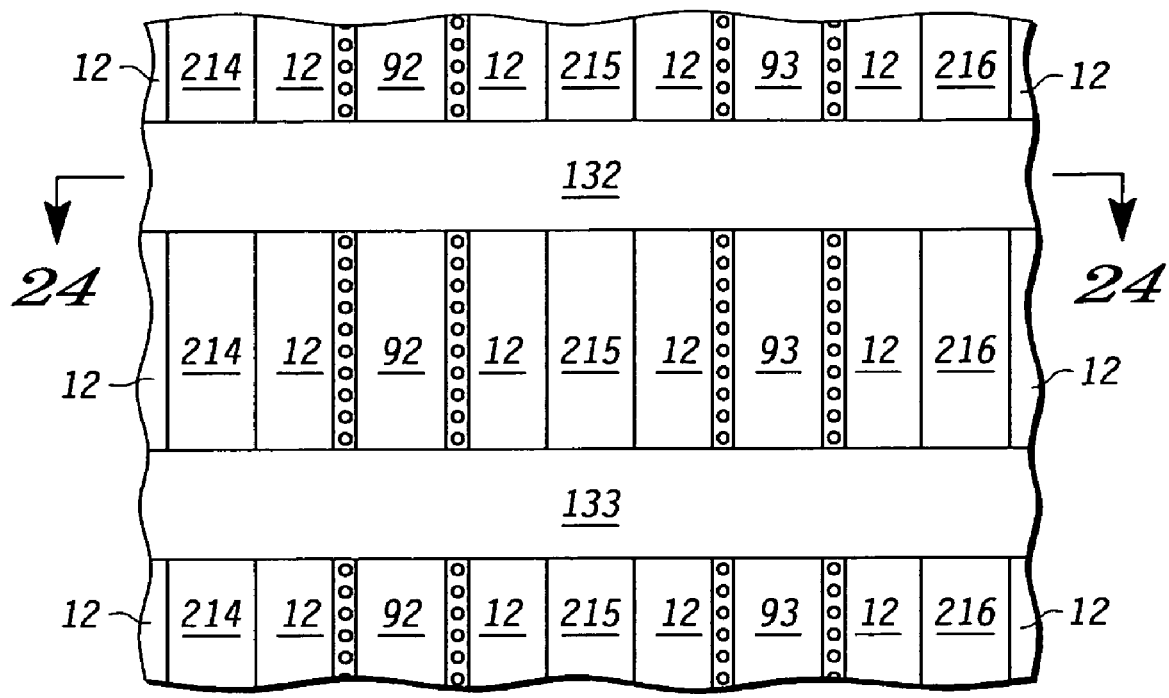
FIGS. 23 and 24 include illustrations of a top view and a cross-sectional view, respectively, of the workpiece of FIGS. 21 and 22 after fabrication of an electronic device is substantially completed.
Figure 24:
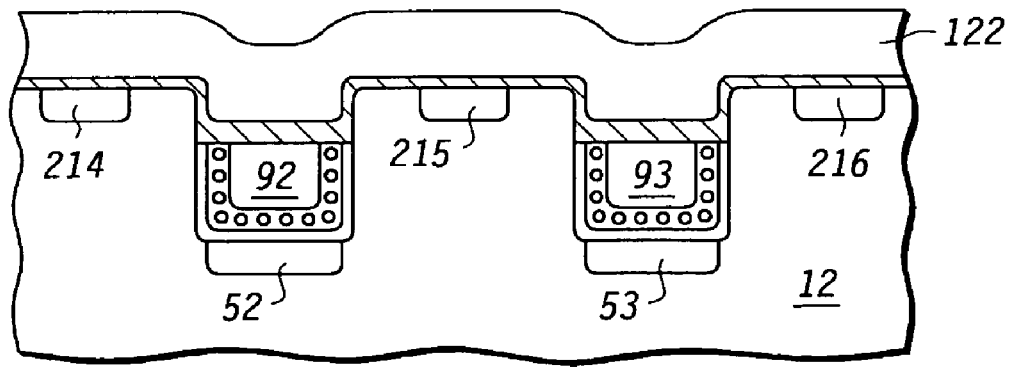

After doped regions 52, 53, 214, 215, and 216 are formed using any one or combination of embodiments described above, processing is continued using any one or more of the embodiments as described with respect to FIGS. 6 through 13. FIGS. 23 and 24 include illustrations of a portion of NVM array 18 are formation of the NVM array is substantially completed. As compared to the conductive lines 194 through 196 in FIGS. 19 and 20, doped regions 214 through 216 can be used in place of conductive lines 194 to 196.

In one embodiment, peripheral electrical connections (not illustrated) are made to access conductive portions of NVM array 18. Protective layer 110 overlying the peripheral areas of substrate 12 can be removed, and another protective layer (not illustrated) can be formed over NVM array 18, which may protect NVM array 18 during component fabrication within the peripheral areas. Processing can be continued to form a substantially completed electronic device. One or more insulating layers, one or more conductive layers, and one or more encapsulating layers are formed using one or more conventional techniques.

In another embodiment, still another NVM array 18 layout and interconnect scheme may be used. The layout and interconnect scheme is similar to an embodiment as illustrated in FIGS. 1 to 12 and 18 to 20 except that a plurality of bit lines lie between trenches 22 and 23, and electrical connections are made between the bit lines and only some of the doped regions underlie the bit lines. The layout and organization will become more apparent after reading the description below with respect to FIGS. 25 to 28.

Figure 25:
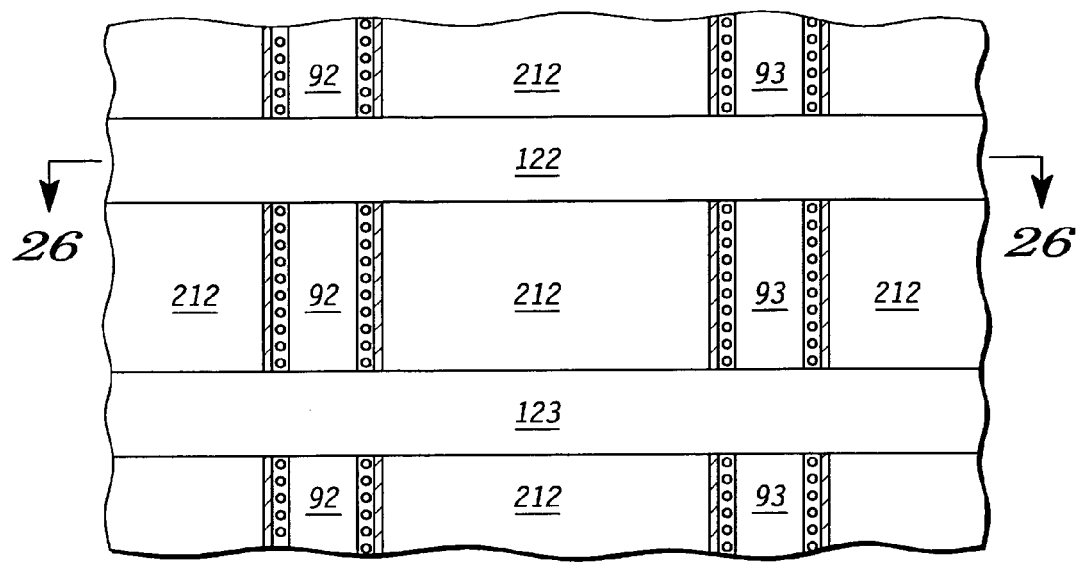
FIGS. 25 and 26 include illustrations of a top view and cross-sectional view of the workpiece of FIG. 12, respectively, except with trenches that are more widely spaced apart from each other.
Figure 26:
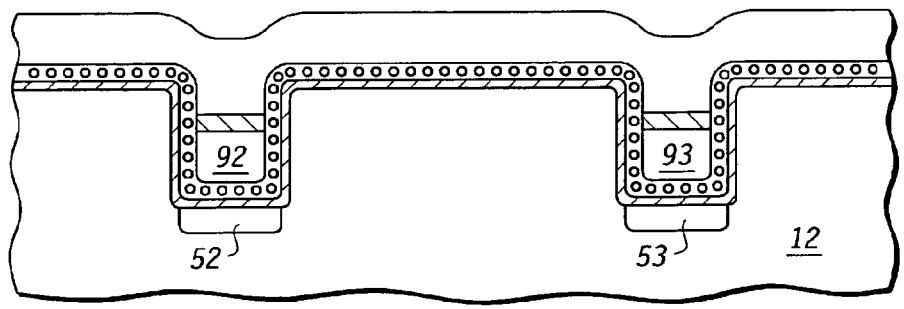

In this embodiment, the process through formation of conductive lines 122 and 123 (FIG. 12) can be performed using any embodiment as previously described with respect to FIGS. 1 to 12. In one embodiment, the space between trenches 22 and 23 may be increased to allow for the proper formation of bit lines and contacts consistent with the design rules, as illustrated in FIGS. 25 and 26. In another embodiment, remaining portions (not illustrated) of protective layer 110 that overlie the peripheral areas of substrate 12 are removed, and another protective layer (not illustrated) can be formed over NVM array 18 which may protect NVM array 18 during component fabrication within the peripheral areas. Component fabrication within the peripheral areas can be performed using one or more conventional techniques. After the component fabrication within the peripheral areas is substantially completed, the protective layer overlying NVM array 18 can be removed.

Figure 27:
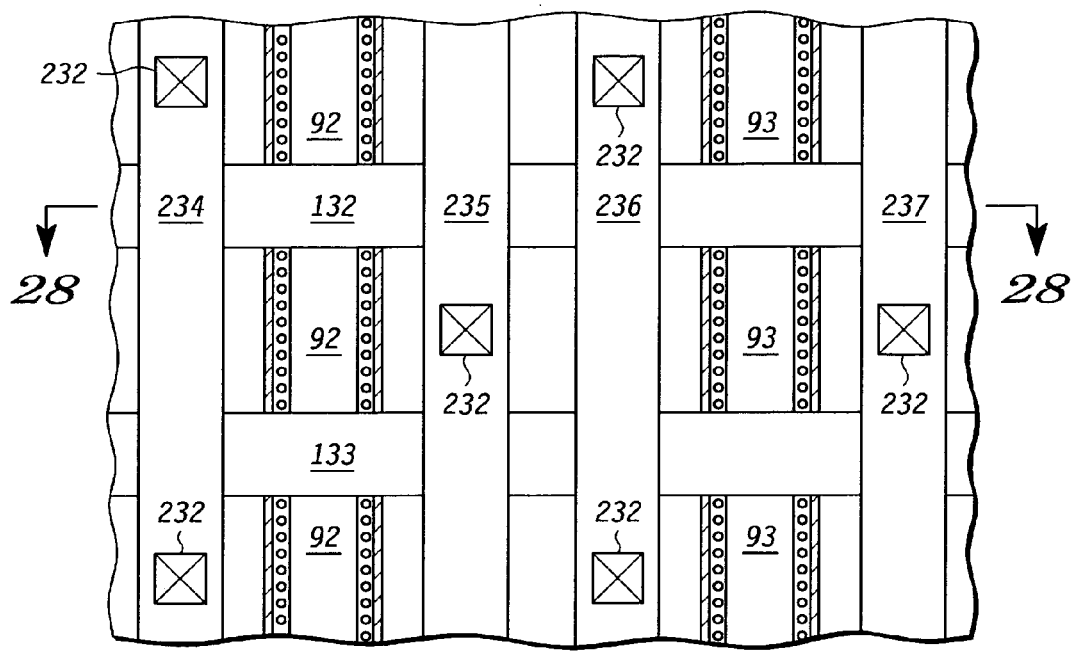
FIGS. 27 and 28 include illustrations of a top view and a cross-sectional view of the workpiece of FIGS. 25 and 26 after fabrication of an electronic device is substantially completed.
Figure 28:
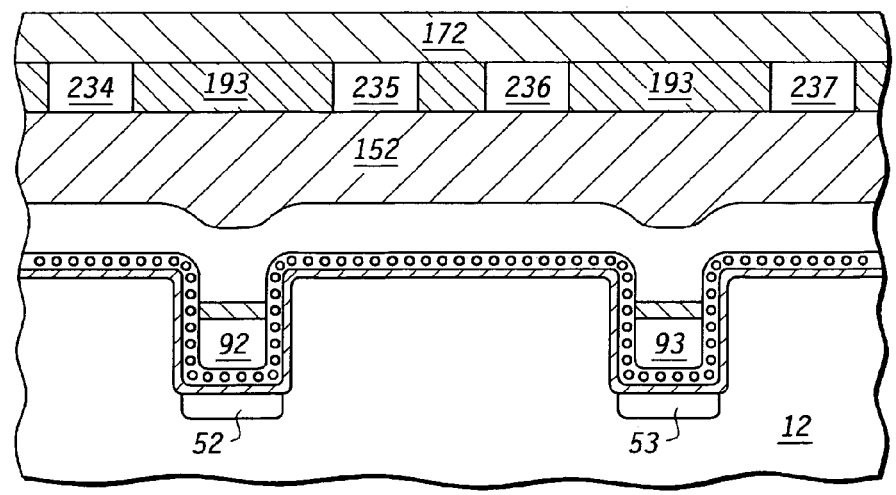

Formation of conductive lines 122 and 123 and doped regions 212, can be performed using any one of the embodiments as described with respect to conductive lines 122 and 123 and doped regions 182, as illustrated in FIG. 18. An interlevel dielectric layer 152 is then formed and patterned to form contact openings, as illustrated in FIGS. 27 and 28, using any of the embodiments as previously described with respect to formation and patterning of interlevel dielectric layer 152. The locations of the contact openings are changed in that contact openings extend to doped regions 212.

Referring to FIGS. 27 and 28, conductive plugs 232 and conductive lines 234 through 237 are then formed using any embodiment as previously described for conductive plugs 192 and conductive lines 194 through 196. Conductive lines 234 through 237 can serve as bit lines within NVM array 18. The locations of conductive plugs 232 and conductive lines 234 through 237 are different from those illustrated for conductive plugs 192 and conductive lines 194 through 196, respectively. The orientation of conductive lines 234 through 237 is substantially the same as the orientation of conductive lines 194 through 196. The lengths of conductive lines 234 and 234 are substantially perpendicular to the lengths of conductive lines 122 and 123, as illustrated in FIG. 27. Unlike conductive lines 194 through 196, each of conductive lines 234 through 237 has electrical connections via conductive plugs 232 to only some of the underlying doped regions 222. In one particular embodiment, the electrical connections to underlying doped regions 222 are alternated between conductive lines 235 and 236. Referring to FIG. 23, conductive line 235 is electrically connected to the middle row of doped regions 222, and a conductive line 236 is electrically connected to the top and bottom rows of doped regions 222.

In another embodiment (not illustrated), additional insulating and conductive layers can be formed and patterned to form additional levels of interconnects. After the last interconnect level has been formed, passivation layer 172 is formed over substrate 12, including NVM array 18 and peripheral areas. Passivation layer 172 can include one or more insulating film, such as an oxide, a nitride, an oxynitride, or a combination thereof.

Figure 29:
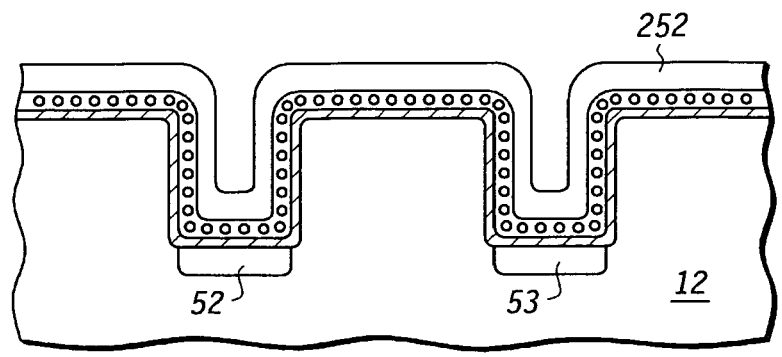
FIG. 29 includes an illustration of a cross-sectional view of the workpiece of FIG. 6 after formation of a conductive layer.

In another alternative embodiment, the gate electrodes within trenches 22 and 23 can have a shape similar to a sidewall spacer. The process may start with the workpiece as illustrated in FIG. 6. Conductive layer 252 can be deposited as illustrated in FIG. 29. In one embodiment, conductive layer 252 is a relatively thinner, substantially conformal layer. Conductive layer 252 can be formed using any one or more embodiments as described with respect to conductive layer 72. The thickness of conductive layer 252 is insufficient to fill in trench structure 22 and 23 within NVM array 18. In one embodiment, the thickness of conductive layer 252 is in a range of approximately 10 nm to approximately 100 nm.

Figure 30:
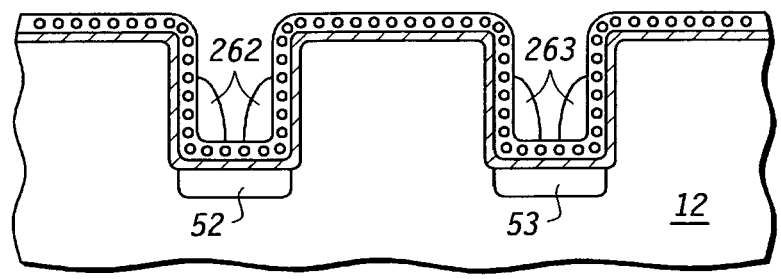
FIG. 30 includes an illustration of a cross-sectional view of the workpiece of FIG. 29 after formation of gate electrodes.

An anisotropic etch of conductive layer 252 can then form gate electrodes 262 and 263 illustrated in FIG. 30. When formed, gate electrodes 262 and 263 can have substantially sidewall spacer shapes within trenches 22 and 23. Although a top view is not illustrated, gate electrodes 262 and 263 are annular, in that each of gate electrodes 262 and 263 lies along the perimeter of trenches 22 and 23. Thus, the spaced-apart left and right portions with facing curved surfaces for each of gate electrodes 262 and 263 within each of trenches 22 and 23 are connected to each other. The processing of NVM array 18 can then be completed as previously described for other embodiments. In one embodiment, when conductive lines 122 and 123 are formed, an additional isotropic etch portion may be used to reduce the likelihood of forming an unintended electrical connection or leakage path between subsequently-formed conductive lines 122 and 123.

After reading this specification, skilled artisans will appreciate that many variations regarding doping portions of the substrate 12 can be used. Doped regions that are at least part of source/drain regions for the memory cells within NVM array 18 have an opposite conductivity type as compared to substrate 12. The portion of substrate 12 as illustrated in the figures may or may not lie within one or more well regions. Such well region(s) may be different from one or more other well regions within peripheral areas (outside NVM array 18). Other doping can be performed that may affect breakdown voltages, resistivity, threshold voltage, hot carrier generation, one or more other electrical characteristics, or any combination thereof. Skilled artisans will be able to form electronic devices having doping characteristics that meet their needs or desires.

NVM array 18 can include memory cells using any of the layouts as previously described. Circuit schematics and cross references to physical embodiments are described to illustrate better how memory cells within NVM array 18 can be electrically configured and programmed.

Figure 31:
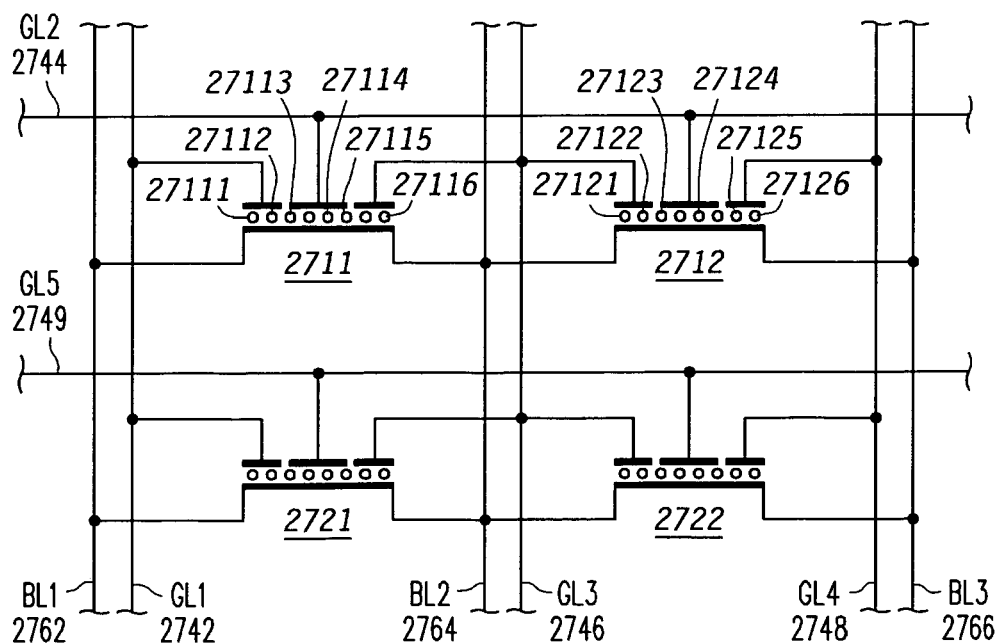
Figures 32, 33:
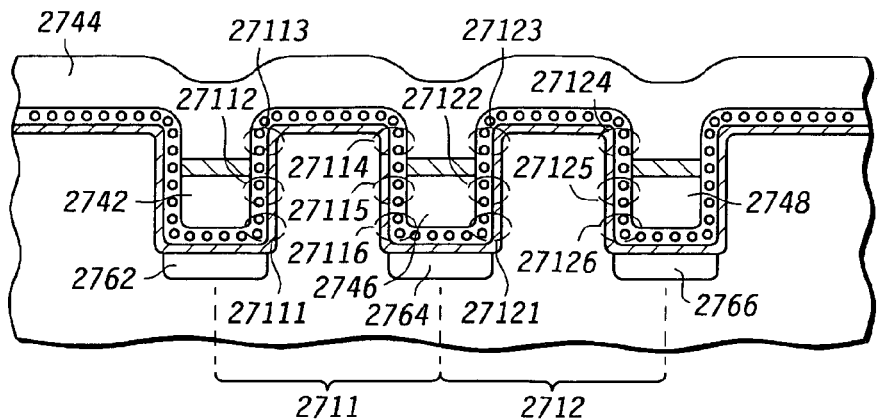

FIG. 31 includes a circuit schematic for an embodiment as described with respect to the embodiment as illustrated in FIG. 32. Memory cells 2711, 2712, 2721, and 2722 are oriented within NVM array 18, as illustrated in FIG. 31. In the figures, "BL" refers to a bit line, and "GL" refers to a gate line. Depending on biasing conditions, a GL can be a control gate line or a select gate line, depending on the biasing conditions.

Referring to FIG. 31, BL1 2762 is electrically connected to a S/D region of memory cell 2711 and a S/D region of memory cell 2721. BL2 2764 is electrically connected to the other S/D regions of memory cells 2711 and 2721 and to a S/D region of memory cell 2712 and a S/D region of memory cell 2722. BL3 2766 is electrically connected to the other S/D regions of memory cells 2712 and 2722. GL1 2742 is electrically connected to a gate electrode of memory cell 2711 and a gate electrode of memory cell 2721. GL2 2744 is electrically connected to gate electrodes of memory cells 2711 and 2712. GL3 27846 is electrically connected to other gate electrodes of memory cells 2711 and 2721 and to a gate electrode of memory cell 2712 and a gate electrode of memory cell 2722. GL4 2748 is electrically connected to gate electrodes of memory cells 2712 and 2722. GL5 2705 is electrically connected to other gate electrodes of memory cells 2721 and 2722.

FIG. 32 illustrates a physical embodiment of a portion of NVM array 18 corresponding to the row that includes memory cells 2711 and 2712. FIG. 32 is a cross-sectional illustration of the workpiece of FIG. 12 labeled with the same reference numbers those used in the circuit schematics in FIG. 32.

Charge storage regions for memory cells 2711 and 2712 are illustrated in FIGS. 31 and 32. Memory cell 2711 includes charge storage regions 27111 to 27114, and memory cell 2712 includes charge storage region 27121 to 27124. Memory cells 2721 and 2722 include similar charge storage regions, but such charge storage regions are not specifically identified in FIG. 31.

FIG. 33 includes a table that has some of the operating voltages for memory cells, as illustrated in FIG. 31. "Pgm" means program. References to charge storage regions 27111, 27112 27113, 27114, 27115, and 27116 refer to memory cell 2711, and more particularly to programming or reading discontinuous storage elements under gate electrodes of memory cell 2711. While many voltages are given in the table in FIG. 33 and other tables within this specification, other voltages may be used. The relative values and ratios between the voltages, rather than their absolute values are more relevant, as the absolute values of voltages change with changes in physical parameters.

All memory cells, as illustrated in FIG. 31 can be erased by creating a potential difference in a range of about 12 to 16 volts between substrate 12 (or well region therein) and the gate electrodes of the memory cells. In one embodiment, erasing can be performed by placing substrate 12 (or well region therein) to approximately +7 volts, placing the gate lines to −7 volts and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

Figure 34:
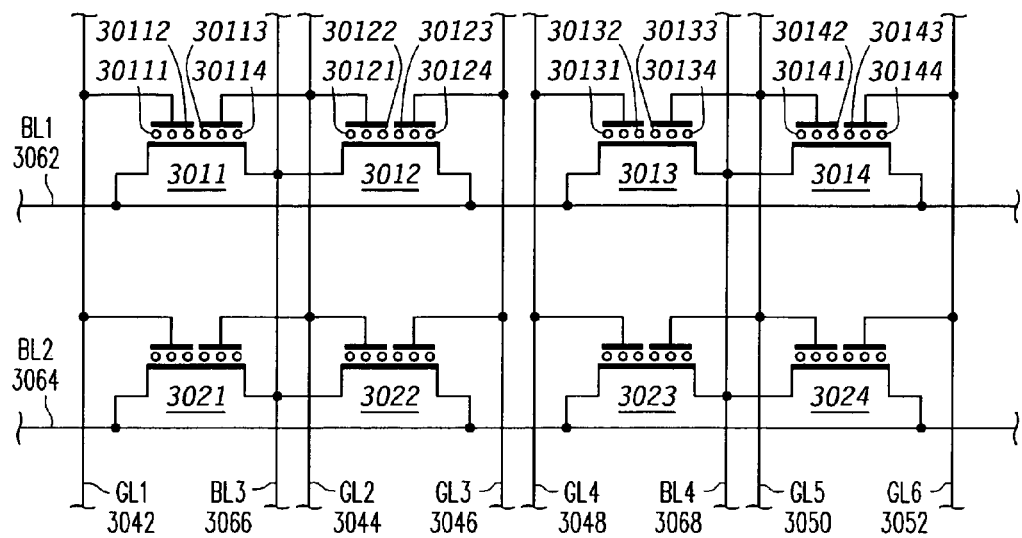
Figure 35:
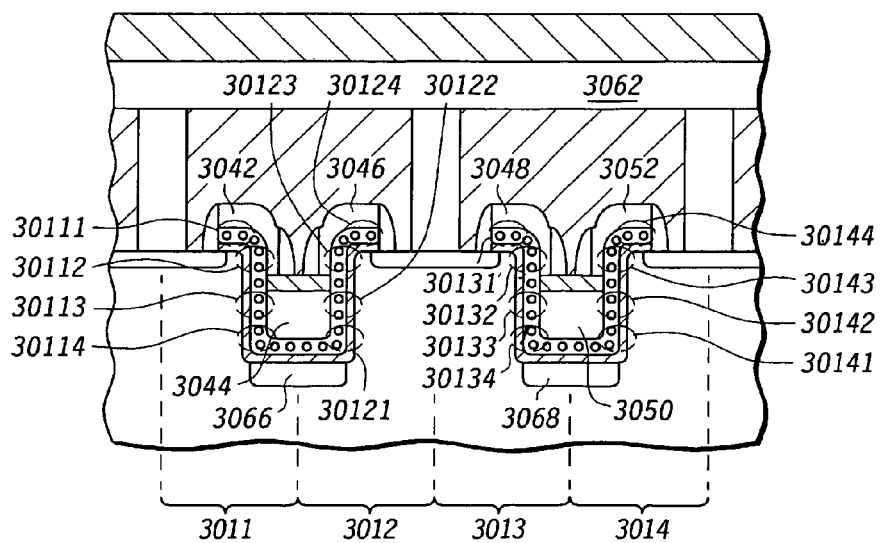

FIG. 34 includes a circuit schematic for an embodiment as described with respect to the embodiment as illustrated in FIG. 35. Memory cells 3011, 3012, 3013, 3014, 3021, 3022, 3023, and 3024 are oriented within NVM array 18, as illustrated in FIG. 34.

Referring to FIG. 34, BL1 3062 is electrically connected to a S/D region of memory cells 3011, 3012, 3013, and 3014. BL2 3064 is electrically connected to a S/D region of memory cells 3021, 3022, 3023, and 3024. BL3 3066 is electrically connected to the other S/D regions of memory cells 3011, 3012, 3021, and 3022. BL4 3068 is electrically connected to the other S/D regions of memory cells 3013, 3014, 3023, and 3024. GL1 3042 is electrically connected to select gate electrodes of memory cells 3011 and 3021. GL2 3044 is electrically connected to control gate electrodes of memory cell 3011, 3012, 3021, and 3022. GL3 3046 is electrically connected to select gate electrodes of memory cells 3012 and 3022. GL4 3048 is electrically connected to select gate electrodes of memory cells 3013 and 3023. GL5 3050 is electrically connected to control gate electrodes of memory cells 3013, 3014, 3023, and 3024. GL6 3052 is electrically connected to select gate electrodes of memory cells 3014 and 3024.

FIG. 35 illustrates a physical embodiment of a portion of NVM array 18 corresponding to the row that includes memory cells 3011, 3012, 3013, and 3014. FIG. 35 is substantially the same as FIG. 17 except that reference numbers as used in the circuit schematics are used in FIG. 35.

Charge storage regions for memory cells 3011 through 3014 are illustrated in FIGS. 34 and 35. Memory cell 3011 includes charge storage regions 30111 to 30114, memory cell 3012 includes charge storage region 30121 to 30124, memory cell 3013 includes charge storage region 30131 to 30134, and memory cell 3014 includes charge storage region 30141 to 30144. Memory cells 3021 through 3024 include similar charge storage regions, but such charge storage regions are not specifically identified in FIG. 34.

FIG. 36 includes a table that has some of the operating voltages for memory cells, as illustrated in FIG. 34.

All memory cells, as illustrated in FIG. 34 can be erased by creating a potential difference in a range of about 12 to 16 volts between substrate 12 (or well region therein) and the gate electrodes of the memory cells. In one embodiment, erasing can be performed by placing substrate 12 (or well region therein) to approximately +7 volts, placing the gate lines to −7 volts and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

Figure 37:
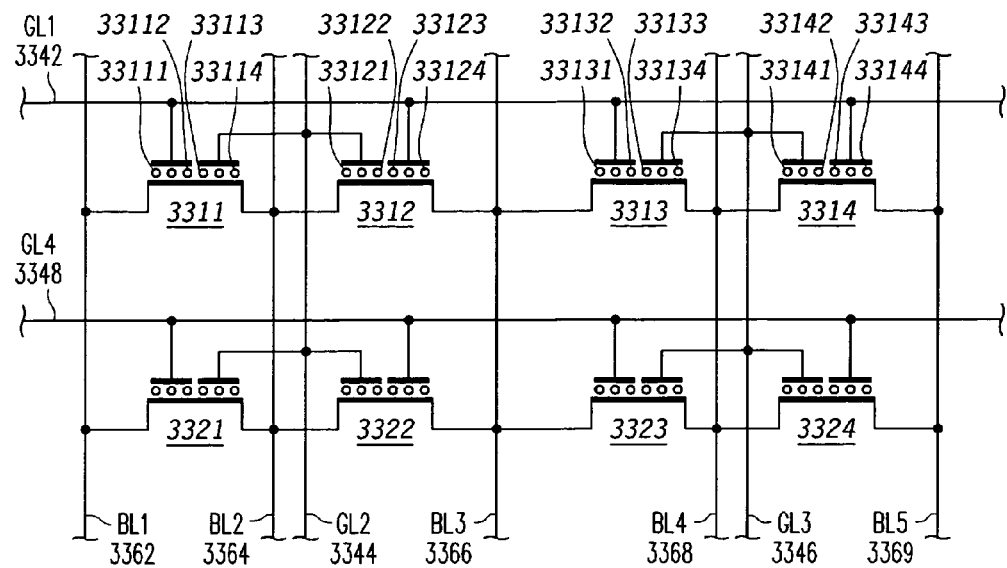
Figure 38:
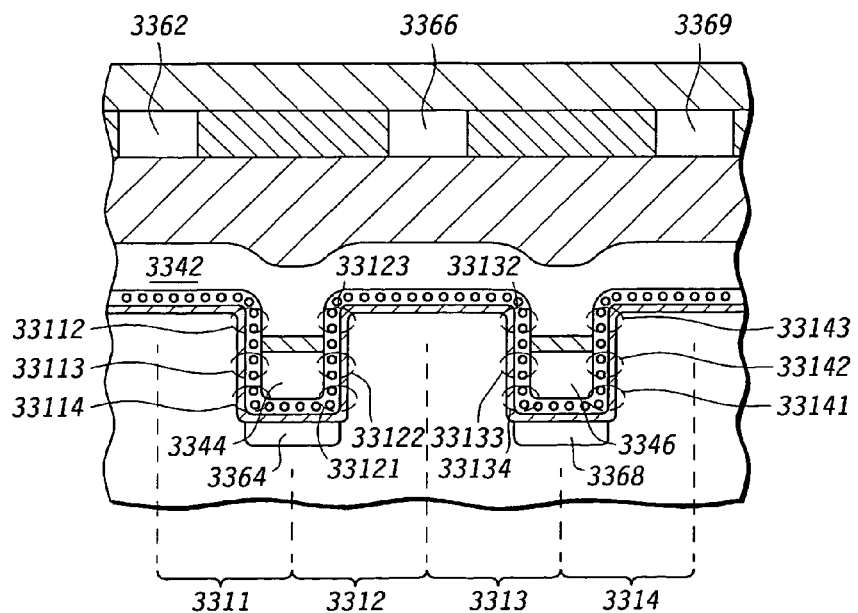

FIG. 37 includes a circuit schematic for an embodiment as described with respect to the embodiment as illustrated in FIG. 38. Memory cells 3311, 3312, 3313, 3314, 3321, 3322, 3323, and 3324 are oriented within NVM array 18, as illustrated in FIG. 37.

Referring to FIG. 37, BL1 3362 is electrically connected to a S/D region of memory cell 3311 and a S/D region of memory cell 3321. BL2 3364 is electrically connected to the other S/D regions of memory cells 3311 and 3321 and to S/D regions of memory cell 3312 and 3322. BL3 3366 is electrically connected to the other S/D regions of memory cell 3312 and 3322 and to S/D regions of memory cell 3313 and 3323. BL4 3368 is electrically connected to the other S/D regions of memory cell 3313 and 3323 and to S/D regions of memory cell 3314 and 3324. BL5 3369 is electrically connected to the other S/D regions of memory cell 3314 and 3324. GL1 3342 is electrically connected to select gate electrodes of memory cell 3311, 3312, 3313, and 3314. GL2 3344 is electrically connected to control gate electrodes of memory cell 3311, 3312, 3321 and 3322. GL3 3346 is electrically connected to control gate electrodes of memory cell 3313, 3314, 3323 and 3324. GL4 3348 is electrically connected to select gate electrodes of memory cell 3321, 3322, 3323, and 3324.

FIG. 38 illustrates a physical embodiment of a portion of NVM array 18 corresponding to the row that includes memory cells 3311, 3312, 3313, and 3314. FIG. 38 is substantially the same as an embodiment of FIG. 20 except that reference numbers as used in the circuit schematics are used in FIG. 38.

Charge storage regions for memory cells 3311 through 3314 are illustrated in FIGS. 37 and 38. Memory cell 3311 includes charge storage regions 33111 to 33114, memory cell 3312 includes charge storage region 33121 to 33124, memory cell 3313 includes charge storage region 33131 to 33134, and memory cell 3314 includes charge storage region 33141 to 33144. Note that charge storage regions 33111, 33124, 33131, and 33144 are not illustrated in FIG. 38, because those charge storage regions are offset from the plane as illustrated in the cross-sectional view of FIG. 38. Memory cells 3321 through 3324 include similar charge storage regions, but such charge storage regions are not specifically identified in FIG. 37.

FIG. 39 includes a table that has some of the operating voltages for memory cells, as illustrated in FIG. 37.

All memory cells, as illustrated in FIG. 37 can be erased by creating a potential difference in a range of about 12 to 16 volts between substrate 12 (or well region therein) and the gate electrodes of the memory cells. In one embodiment, erasing can be performed by placing substrate 12 (or well region therein) to approximately +7 volts, placing the gate lines to −7 volts and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

The embodiments as described with respect to FIGS. 21 through 24 can be represented by the circuit schematic as illustrated in FIG. 37 and can be operated using the voltages as listed in FIG. 39.

Figure 40:
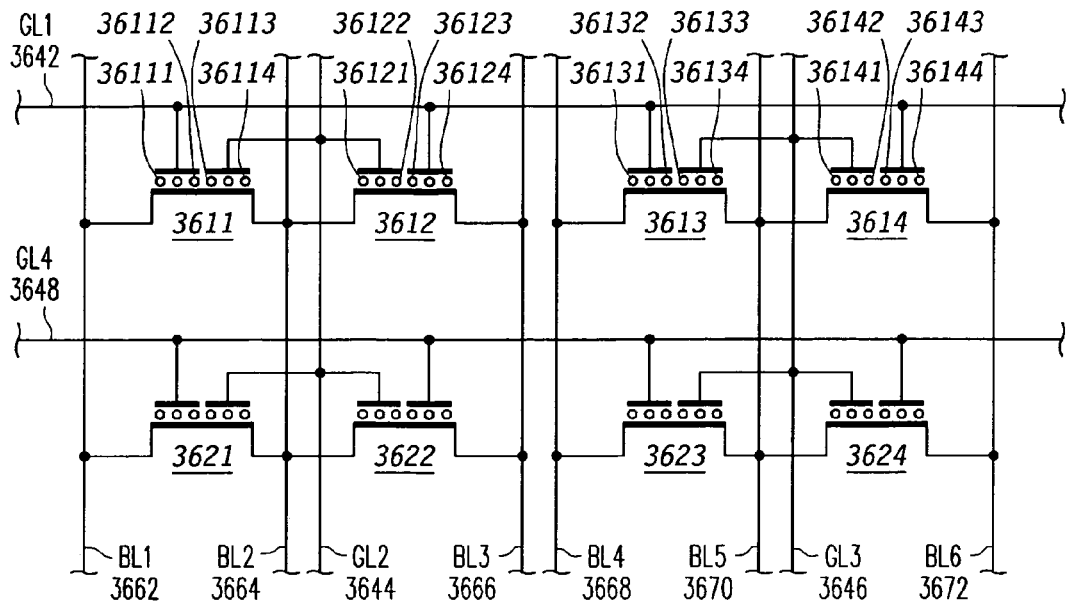
Figure 41:
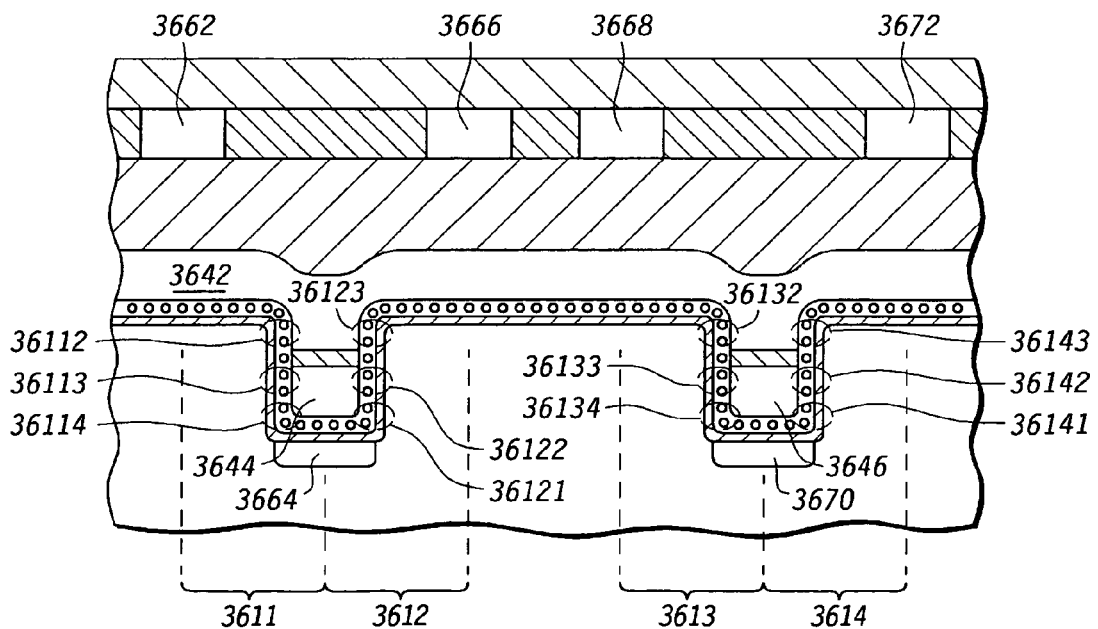

FIG. 40 includes a circuit schematic for an embodiment as described with respect to the embodiment as illustrated in FIG. 41. Memory cells 3611, 3612, 3613, 3614, 3621, 3622, 3623, and 3624 are oriented within NVM array 18, as illustrated in FIG. 40.

Referring to FIG. 40, BL1 3662 is electrically connected to a S/D region of memory cell 3611 and a S/D region of memory cell 3621. BL2 3664 is electrically connected to the other S/D regions of memory cell 3611 and 3621 and to S/D regions of memory cells 3612 and 3622. BL3 3666 is electrically connected to the other S/D regions of memory cells 3612 and 3622. BL4 3668 is electrically connected to S/D regions of memory cells 3613 and 3623. BL5 3670 is electrically connected to the other S/D regions of memory cells 3613 and 3623, and S/D regions of memory cells 3614 and 3624. BL6 3672 is electrically connected to the other S/D regions of memory cells 3614 and 3624. GL1 3642 is electrically connected to select gate electrodes of memory cell 3611, 3612, 3613, and 3614. GL2 3644 is electrically connected to control gate electrodes of memory cell 3611, 3612, 3621, and 3622. GL3 3646 is electrically connected to control gate electrodes of memory cell 3613, 3614, 3623, and 3624. GL4 3648 is electrically connected to select gate electrodes of memory cell 3621, 3622, 3623, and 3624.

FIG. 41 illustrates a physical embodiment of a portion of NVM array 18 corresponding to the row that includes memory cells 3611, 3612, 3613, and 3614. FIG. 41 is substantially the same as FIG. 28 except that reference numbers as used in the circuit schematics are used in FIG. 41.

Charge storage regions for memory cells 3611 through 3614 are illustrated in FIGS. 40 and 41. Memory cell 3611 includes charge storage regions 36111 to 36114, memory cell 3612 includes charge storage region 36121 to 36124, memory cell 3613 includes charge storage region 36131 to 36134, and memory cell 3614 includes charge storage region 36141 to 36144. Note that charge storage regions 36111, 36124, 36131, and 36144 are not illustrated in FIG. 41, because those charge storage regions are offset from the plane as illustrated in the cross-sectional view of FIG. 41. Memory cells 3621 through 3624 include similar charge storage regions, but such charge storage regions are not specifically identified in FIG. 40.

FIG. 42 includes a table that has some of the operating voltages for memory cells, as illustrated in FIG. 40.

All memory cells, as illustrated in FIG. 40 can be erased by creating a potential difference in a range of about 12 to 16 volts between substrate 12 (or well region therein) and the gate electrodes of the memory cells. In one embodiment, erasing can be performed by placing substrate 12 (or well region therein) to approximately +7 volts, placing the gate lines to −7 volts and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

Many details have been described with respect to NVM array 18, its memory cells, bit lines, and gate lines. After reading this specification, skilled artisans will appreciate that the row and column orientations can be reversed. Electrically connections between memory cells and their associated bit lines, gate lines, or any combination thereof along one or more rows can be changed to one or more columns. Similarly, electrically connections between memory cells and their associated bit lines, gate lines, or any combination thereof along one or more columns can be changed to one or more rows.

Embodiments as described herein are useful in forming NMV arrays or a portion thereof. The use of discontinuous storage elements within a trench in the substrate allows smaller memory cells to be formed and increase memory density. The discontinuous storage elements can also allow more bits to be stored within a memory cell as opposed to a conventional floating gate structure. In one embodiment, portions of the discontinuous storage elements lie between all of the gate electrodes and the substrate. In a particular embodiment, the portions of the discontinuous storage elements lie between all of the gate electrodes and the substrate at substantially all locations where gate electrodes overlie the substrate. The portions of discontinuous storage elements can allow up to six bits of data to be stored per memory cell. The fabrication of the NVM array can be implemented using existing materials and equipment. Therefore, process integration would not require developing new processes for new equipment or having to address materials incompatibility issues. The memory cells can be formed such that select gate lines are formed, such that they are at least partly recessed within the trenches.

Source-side injection can be used to program some of the charge storage regions of memory cells. The thickness of the intergate dielectric portions 114 and 115 and programming voltages can be selected to allow a relatively larger electrical field to be generated near the intergate dielectric portions 114 and 115 as compared to near the S/D regions that are electrically connected to the bit lines. The source-side injection allows programming times similar to conventional hot-electron injection and has a higher electron efficiency compared to conventional hot-electron injection.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a substrate, including a first trench that includes a wall and a bottom and extends from a primary surface of the substrate. The electronic device can also include discontinuous storage elements, wherein a first portion of discontinuous storage elements lies within the first trench. The electronic device can also include a first gate electrode having an upper surface that lies below the primary surface of the substrate, wherein at least a part of the first portion of the discontinuous storage elements lies along the wall of the first trench at an elevation between the upper surface of the first gate electrode and the primary surface, and a second gate electrode overlying the first gate electrode and the primary surface of the substrate.

In one embodiment of the first aspect, at least a portion of the second gate electrode extends at least partly into the first trench. In a particular embodiment, the electronic device further includes a third gate electrode. The substrate can further include a second trench that is spaced apart from the first trench, wherein the second trench includes a wall and a bottom and extends from that primary surface of the substrate. The electronic device can further include a second portion of the discontinuous storage elements that lies at least within the second trench. The third gate electrode has an upper surface that lies below the primary surface of the substrate, wherein at least a part of the second portion of the discontinuous storage elements lies along the wall of the second trench at an elevation between the upper surface of the third gate electrode and the primary surface.

In a more particular embodiment of the first aspect, the electronic device can further include a first doped region lying within the substrate below the first trench, and a second doped region lying within the substrate below the second trench. In an even more particular embodiment, the electronic device further includes a third doped region lying along the primary surface of the substrate between the first and second trenches. In a yet more particular embodiment, the third doped region extends to the walls of the first and second trenches. In another yet more particular embodiment, the third doped region is spaced apart from the walls of the first and second trenches.

In another even more particular embodiment of the first aspect, a first charge storage region includes a first discontinuous storage element within the first portion of the discontinuous storage elements, wherein the first discontinuous storage element lies closer to the upper surface of the first gate electrode than the first doped region. A second charge storage region includes a second discontinuous storage element within the first portion of the discontinuous storage elements, wherein the second discontinuous storage element lies closer to the first doped region than the upper surface of the first gate electrode, and wherein the second charge storage region is spaced apart from the first charge storage region. A third charge storage region includes a third discontinuous storage element within the second portion of the discontinuous storage elements, wherein the third discontinuous storage element lies closer to the upper surface of the third gate electrode than the second doped region. A fourth charge storage region includes a fourth discontinuous storage element within the second portion of the discontinuous storage elements, wherein the fourth discontinuous storage element lies closer to the second doped region than the upper surface of the third gate electrode, and wherein the fourth charge storage region is spaced apart from the third charge storage region.

In another particular embodiment of the first aspect, the second gate electrode overlies the first gate electrode, the third gate electrode, and a portion the substrate between the first and second trenches. In yet another particular embodiment, the electronic device further includes a fourth gate electrode spaced apart from the third gate electrode, wherein the second gate electrode overlies the first gate electrode and a first portion of the substrate between the first and second trenches, and the fourth gate electrode overlies the third gate electrode and a second portion of the substrate between the first and second trenches. In another embodiment, the electronic further includes an array, wherein within the array, the discontinuous storage elements overlie substantially all of the primary surface and along substantially all of the wall of the first trench. In still another embodiment, the discontinuous storage elements include silicon nanocrystals or metal nanoclusters. In yet another embodiment, from a cross-sectional view, the first gate electrode has a substantially rectangular shape. In another embodiment, from a cross-sectional view, the first gate electrode includes portions, and the portions of the first gate electrode include curved outer surfaces that face each other.

In a second aspect, an electronic device can include a substrate including a first trench and a second trench that are spaced apart from each other, wherein each of the first and second trenches includes a wall and a bottom and extends from a primary surface of the substrate. The substrate can also include a first doped region lying within the substrate along the bottom of the first trench, a second doped region lying within the substrate along the bottom of the second trench, and a first dielectric layer lying along the walls and bottoms of the first and second trenches. The electronic device can also include discontinuous storage elements, wherein a first portion of the discontinuous storage elements lie at least within the first trench, a second portion of the discontinuous storage elements lie at least within the second trench, and a third portion of the discontinuous storage elements overlie the primary surface of the substrate. The third portion of the discontinuous storage elements can be contiguous with each of the first and second portions of the discontinuous storage elements. The electronic device can also include a second dielectric layer adjacent to the discontinuous storage elements within the first and second trenches. The electronic device can further include a first gate electrode lying within the first trench and having an upper surface that lies below the primary surface of the substrate, wherein at least a part of the first portion of the discontinuous storage elements lies along the wall of the first trench at an elevation between the upper surface of the first gate electrode and the primary surface. The electronic device can also include a second gate electrode lying within the second trench and having an upper surface that lies below the primary surface of the substrate, wherein at least a part of the second portion of the discontinuous storage elements lies along the wall of the second trench at an elevation between the upper surface of the second gate electrode and the primary surface. The electronic device can still further include a third dielectric layer including a first portion overlying the first gate electrode within the first trench and a second portion overlying the second gate electrode within the second trench. The electronic device can also include a third gate electrode overlying at least one of the first gate electrode or the second gate electrode, wherein the third gate electrode lies at least partly within the first trench and the second trench.

In a third aspect, an electronic device can include a first set of memory cells oriented substantially along a first direction, and a second set of memory cells oriented substantially along the first direction. The electronic device can also include a first conductive line electrically connected to the first set of memory cells, wherein the first conductive line is of a type including a gate line or a bit line. The electronic device can also include a second conductive line electrically connected to the second set of memory cells, wherein the second conductive line is of a same type as the first conductive line, and when compared to the first conductive line, the second conductive line is electrically connected to more sets of memory cells that lie along the first direction.

In one embodiment of the third aspect, each memory cell within the first and second sets of memory cells includes a nonvolatile memory cell that includes a first gate electrode and a second gate electrode. For each memory cell within the first and second sets of memory cells, a discontinuous storage element lies between a channel region and the first gate electrode, and another discontinuous storage element lies between the channel region and the second gate electrode. In a particular embodiment, the electronic device further includes a third set of memory cells oriented substantially along the first direction, wherein the first, second, and third sets of memory cells lie within different rows or different columns as compared to one another. Each memory cell within the third set of memory cells includes a nonvolatile memory cell that includes a first gate electrode and a second gate electrode. For each memory cell within the third set of memory cells, a discontinuous storage element lies between a channel region and the first gate electrode, and another discontinuous storage element lies between the channel region and the second gate electrode. The first conductive line is a first gate line that is electrically connected to the first gate electrodes of the first set of memory cells, and the second conductive line is a second gate line that is electrically connected to the second gate electrodes of the second and third sets of memory cells.

In another embodiment of the third aspect, the electronic device further includes a third set of memory cells oriented substantially along the first direction, wherein the first, second, and third sets of memory cells lie within different rows or different columns as compared to one another. The first conductive line is a first bit line, and the second conductive line is a second bit line electrically connected to the second and third sets of memory cells. In another embodiment, the first direction is associated with a row or a column.

In a fourth aspect, a process for forming an electronic device can include forming a first trench within a substrate, wherein the first trench includes a wall and a bottom and extends from a primary surface of the substrate. The process also can include forming discontinuous storage elements over the primary surface and within the first trench, wherein a first portion of the discontinuous storage elements lie within the first trench. The process can further include forming a first gate electrode within the first trench after forming the discontinuous storage elements, wherein the first gate electrode has an upper surface that lies below the primary surface of the substrate, and at least part of the first portion of the discontinuous storage elements lies between the first gate electrode and the wall of the first trench. The process can still further include forming a second gate electrode that overlies the first gate electrode and the primary surface of the substrate, wherein after forming the second gate electrode, at least a part of the first portion of the discontinuous storage elements lies along the wall of the first trench at an elevation between an upper surface of the first gate electrode and the primary surface of the substrate.

In one embodiment of the fourth aspect, forming the second gate electrode includes forming the second gate electrode, such that at least a portion of the second gate electrode extends at least partly into the first trench. In another embodiment, the process further includes forming a third gate electrode within a second trench. Forming the first trench further includes forming a second trench that is spaced apart from the first trench, wherein the second trench includes a wall and a bottom and extends from a primary surface of the substrate. Forming the discontinuous storage elements further includes forming the discontinuous storage elements within the second trench, wherein a second portion of the discontinuous storage elements lie within the second trench. Forming the third gate electrode includes forming the third gate electrode, such that the third gate electrode has an upper surface that lies below the primary surface of the substrate, and at least a part of the second portion of the discontinuous storage elements lies between the third gate electrode and the wall of the second trench. After forming the second gate electrode, at least a part of the second portion of the discontinuous storage elements lies along the wall of the second trench at an elevation between the upper surface of the third gate electrode and the primary surface of the substrate.

In a particular embodiment of the fourth aspect, the process further includes forming a first doped region and a second doped region along the bottoms of the first and second trenches, respectively. In another particular embodiment, the process further includes forming a third doped region lying along the primary surface of the substrate between the first and second trenches. In a more particular embodiment, forming the third doped region is performed before forming the second gate electrode. In another, more particular embodiment, forming the third doped region is performed after forming the second gate electrode.

In another particular embodiment of the fourth aspect, after forming the second gate electrode, a first charge storage region includes a first discontinuous storage element, wherein the first discontinuous storage element lies closer to the upper surface of the first gate electrode than the first doped region. A second charge storage region includes a second discontinuous storage element within the first portion of the discontinuous storage elements, wherein the second discontinuous storage element lies closer to the first doped region than the upper surface of the first gate electrode, and wherein the second charge storage region is spaced apart from the first charge storage region. A third charge storage region includes a third discontinuous storage element, wherein the third discontinuous storage element lies closer to the upper surface of the third gate electrode than the second doped region. A fourth charge storage region includes a fourth discontinuous storage element within the second portion of the discontinuous storage elements, wherein the fourth discontinuous storage element lies closer to the second doped region than the upper surface of the third gate electrode, and wherein the fourth charge storage region is spaced apart from the third charge storage region.

In yet another particular embodiment of the fourth aspect, forming the second gate electrode includes forming the second gate electrode such that the second gate electrode overlies the first and third gate electrodes, and from a top view, lengths of the first and second trenches are substantially perpendicular to a length of the second gate electrode. In still another particular embodiment, the process further includes forming a fourth gate electrode, wherein forming the second gate electrode includes forming the second gate electrode that overlies the first gate electrode, and forming the fourth gate electrode includes forming the fourth gate electrode, such that the fourth gate electrode that overlies the third gate electrode. From a top view a length of the first trench is substantially parallel to a length of the second gate electrode, and a length of the second trench is substantially parallel to a length of the fourth gate electrode.

In another embodiment of the fourth aspect, the process further includes forming a first dielectric layer lying along the wall and bottom of the first trench, forming a second dielectric layer after forming the discontinuous storage elements, and forming a third dielectric layer after forming the first gate electrode. In a particular embodiment, forming the third dielectric layer includes forming the third dielectric layer, such that at least one discontinuous storage element within the first portion of discontinuous storage elements lies at an elevation between the primary surface of the substrate and an upper surface of a portion of the third dielectric layer that lies within the first trench.

In another embodiment of the fourth aspect, forming the first gate electrode includes forming a conductive layer after forming the discontinuous storage elements, polishing the conductive layer to remove a portion of the conductive layer that overlies the primary surface of the substrate, and recessing the conductive layer within the first trench to form the first gate electrode. In yet another embodiment, forming the first gate electrode includes forming a conductive layer after forming the discontinuous storage elements, and anisotropically etching the conductive layer to form the first gate electrode, which from a cross-sectional view, has a sidewall spacer shape. In still another embodiment, forming discontinuous storage elements includes forming silicon nanocrystals or forming metal nanoclusters.

In a fifth aspect, a process for forming an electronic device can include forming a first trench and a second trench within a substrate, wherein the first trench is spaced apart from the second trench, and each of the first and second trenches includes a wall and a bottom and extends from a primary surface of the substrate. The process can also include forming discontinuous storage elements over the primary surface and within the first and second trenches, wherein a first portion of the discontinuous storage elements lies within the first trench, and a second portion of the discontinuous storage elements lies within the second trench. The process can further include forming a first conductive layer after forming the discontinuous storage elements, and removing a portion of the first conductive layer that overlies the primary surface of the substrate to form a first gate electrode within the first trench and a second gate electrode within the second trench. The first gate electrode has an upper surface that lies below the primary surface of the substrate, and a first discontinuous storage element within the first portion of the discontinuous storage elements lies between the first gate electrode and the wall of the first trench. The second gate electrode has an upper surface that lies below the primary surface of the substrate, and a second discontinuous storage element within the second portion of the discontinuous storage elements lies between the second gate electrode and the wall of the first trench. The process can still further include forming a first dielectric layer over the first and second gate electrodes, wherein the first gate dielectric has a first portion with an upper surface within the first trench and a second portion with an upper surface within the second trench. The process can yet further include forming a second conductive layer after removing the portion of the first conductive layer that overlies the primary surface of the substrate, and patterning the second conductive layer to form a third gate electrode that overlies the first gate electrode and the primary surface of the substrate. After patterning the second conductive layer, at least a part of the first portion of the discontinuous storage elements lies along the wall of the first trench at an elevation between the upper surface of the first portion of the first dielectric layer and the primary surface of the substrate, and at least a part of the second portion of the discontinuous storage elements lies along the wall of the second trench at an elevation between the upper surface of the second portion of the first dielectric layer and the primary surface of the substrate.

In one embodiment of the fifth aspect, the process further includes forming a first doped region and a second doped region along the bottoms of the first and second trenches, respectively. In a particular embodiment, the process further includes forming a third doped region lying along the primary surface of the substrate between the first and second trenches.

In another embodiment of the fifth aspect, after patterning the second conductive layer, a first charge storage region includes the first discontinuous storage element, wherein the first discontinuous storage element lies closer to the upper surface of the first gate electrode than the first doped region. A second charge storage region includes a third discontinuous storage element within the first portion of the discontinuous storage elements, wherein the third discontinuous storage element lies closer to the first doped region than the upper surface of the first gate electrode, and wherein the second charge storage region is spaced apart from the first charge storage region. A third charge storage region includes the second discontinuous storage element, wherein the second discontinuous storage element lies closer to the upper surface of the second gate electrode than the second doped region. A fourth charge storage region includes a fourth discontinuous storage element within the second portion of the discontinuous storage elements, wherein the fourth discontinuous storage element lies closer to the second doped region than the upper surface of the second gate electrode, and wherein the fourth charge storage region is spaced apart from the third charge storage region.

In yet another embodiment, forming discontinuous storage elements includes forming silicon nanocrystals or forming metal nanoclusters.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising:
   a substrate including a first trench that includes a wall and a bottom and extends from a primary surface of the substrate;

discontinuous storage elements, wherein a first portion of the discontinuous storage elements lies within the first trench, and a second portion of the discontinuous storage elements overlies the primary surface outside of the first trench;

a first gate electrode having an upper surface that lies below the primary surface of the substrate; and a second gate electrode overlying the first gate electrode and the primary surface of the substrate, wherein:
within a memory cell, a first discontinuous storage element and a second discontinuous storage element lie within the first trench at elevations higher than the upper surface of the first gate electrode;
all of the first discontinuous storage element lies at an elevation higher than all of the second discontinuous storage element; and
the second portion of the discontinuous storage element lies between the second gate electrode and the primary surface of the substrate.

2. The electronic device of claim 1, wherein at least a portion of the second gate electrode extends at least partly into the first trench.

3. The electronic device of claim 2, further comprising a third gate electrode, wherein:
the substrate further includes a second trench that is spaced apart from the first trench, wherein the second trench includes a wall and a bottom and extends from the primary surface of the substrate;
a third portion of the discontinuous storage elements lies at least within the second trench; and
the third gate electrode has an upper surface that lies below the primary surface of the substrate, wherein at least a part of the third portion of the discontinuous storage elements lies along the wall of the second trench at an elevation between the upper surface of the third gate electrode and the primary surface.

4. The electronic device of claim 3, further comprising:
a first doped region lying within the substrate below the first trench; and
a second doped region lying within the substrate below the second trench.

5. The electronic device of claim 4, further comprising a third doped region lying along the primary surface of the substrate between the first and second trenches.

6. The electronic device of claim 5, wherein the third doped region extends to the walls of the first and second trenches.

7. The electronic device of claim 5, wherein the third doped region is spaced apart from the walls of the first and second trenches.

8. The electronic device of claim 4, wherein:
a first charge storage region includes a first discontinuous storage element within the first portion of the discontinuous storage elements, wherein the first discontinuous storage element lies closer to the upper surface of the first gate electrode than the first doped region;
a second charge storage region includes a second discontinuous storage element within the first portion of the discontinuous storage elements, wherein the second discontinuous storage element lies closer to the first doped region than the upper surface of the first gate electrode, and wherein the second charge storage region is spaced apart from the first charge storage region;
a third charge storage region includes a third discontinuous storage element within the third portion of the discontinuous storage elements, wherein the third discontinuous storage element lies closer to the upper surface of the third gate electrode than the second doped region; and
a fourth charge storage region includes a fourth discontinuous storage element within the third portion of the discontinuous storage elements, wherein the fourth discontinuous storage element lies closer to the second doped region than the upper surface of the third gate electrode, and wherein the fourth charge storage region is spaced apart from the third charge storage region,
wherein an individual memory cell of the electronic device includes the first, second, third, and fourth charge storage regions.

9. The electronic device of claim 3, wherein the second gate electrode overlies the first gate electrode, the third gate electrode, and a portion the substrate between the first and second trenches.

10. The electronic device of claim 3, further comprising a fourth gate electrode spaced apart from the third gate electrode, wherein:
the second gate electrode overlies the first gate electrode and a first portion of the substrate between the first and second trenches;
the fourth gate electrode overlies the third gate electrode and a second portion of the substrate between the first and second trenches;
from a top view, each of the first, second, third and fourth gate electrodes has a length and a width that is smaller than the length; and
the lengths of the first, second, third, and fourth gate electrodes are substantially parallel to one another.

11. The electronic device of claim 1, further comprising an army, wherein within the array, the discontinuous storage elements overlie substantially all of the primary surface outside of the trenches and along substantially all of the wall of the first trench.

12. The electronic device of claim 1, wherein the discontinuous storage elements comprise silicon nanocrystals or metal nanoclusters, wherein each discontinuous storage element is no greater than approximately 10 nm in each and every dimension.

13. The electronic device of claim 1, wherein:
from a top view, the first trench has a length and a width that is smaller than the length; and
from a cross-sectional view along a plane parallel to the width of the first trench, at least three different discontinuous storage elements of the discontinuous storage elements overlie the bottom of the first trench.

14. The electronic device of claim 1, wherein from a cross-sectional view:
the first gate electrode includes portions that are spaced apart from each other within the first trench;
no portion of the first gate electrode overlies a center of the bottom of the first trench; and
the portions of the first gate electrode include curved outer surfaces that face each other.

15. An electronic device comprising:
a substrate including a first trench and a second trench that are spaced apart from each other; wherein each of the first and second trenches includes a wall and a bottom and extends from a primary surface of the substrate;
a first doped region lying within the substrate along the bottom of the first trench;
a second doped region lying within the substrate along the bottom of the second trench;
a first dielectric layer lying along the walls and bottoms of the first and second trenches;
discontinuous storage elements, wherein:
a first portion of the discontinuous storage elements lie at least within the first trench;

a second portion of the discontinuous storage elements lie at least within the second trench; and a third portion of the discontinuous storage elements overlie the primary surface of the substrate, wherein the third portion of the discontinuous storage elements is contiguous with each of the first and second portions of the discontinuous storage elements;

a second dielectric layer adjacent to the discontinuous storage elements within the first and second trenches;

a first gate electrode lying within the first trench and having an upper surface that lies below the primary surface of the substrate, wherein at least a part of the first portion of the discontinuous storage elements lies along the wall of the first trench at an elevation between the upper surface of the first gate electrode and the primary surface;

a second gate electrode lying within the second trench and having an upper surface that lies below the primary surface of the substrate, wherein at least a part of the second portion of the discontinuous storage elements lies along the wall of the second trench at an elevation between the upper surface of the second gate electrode and the primary surface;

a third dielectric layer including a first portion overlying the first gate electrode within the first trench and a second portion overlying the second gate electrode within the second trench; and a third gate electrode overlying at least one of the first gate electrode or the second gate electrode, wherein the third gate electrode lies at least partly within the first trench and the second trench.

* * * * *